United States Patent
Mardian et al.

(10) Patent No.: US 7,044,997 B2
(45) Date of Patent: May 16, 2006

(54) PROCESS BYPRODUCT TRAP, METHODS OF USE, AND SYSTEM INCLUDING SAME

(75) Inventors: Allen P. Mardian, Boise, ID (US); Philip H. Campbell, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 10/669,755

(22) Filed: Sep. 24, 2003

(65) Prior Publication Data
US 2005/0061150 A1 Mar. 24, 2005

(51) Int. Cl.
*B01D 8/00* (2006.01)
*B01D 45/00* (2006.01)

(52) U.S. Cl. ............ 95/1; 95/14; 95/288; 96/417; 96/420; 55/282.2; 55/385.2; 55/434.2; 55/DIG. 15; 62/55.5

(58) Field of Classification Search .......... 55/385.2, 55/434.2, 282.2, DIG. 15; 95/288, 1, 14; 96/417, 420; 62/55.5; 118/715; 156/345.29
See application file for complete search history.

(56) References Cited

U.S. PATENT DOCUMENTS

| | | | |
|---|---|---|---|
| 3,719,052 A | 3/1973 | White | |
| 4,290,822 A | 9/1981 | Maupre et al. | |
| 4,291,865 A | 9/1981 | Grundy | |
| 4,479,927 A | 10/1984 | Gelernt | |
| 4,506,513 A | 3/1985 | Max | |
| 5,820,641 A | 10/1998 | Gu et al. | |
| RE36,925 E * | 10/2000 | Ohba et al. | 134/1 |
| 6,206,971 B1 | 3/2001 | Umotoy et al. | |
| 6,241,793 B1 | 6/2001 | Lee et al. | |
| 6,319,299 B1 | 11/2001 | Shih et al. | |
| 6,488,745 B1 | 12/2002 | Gu | |
| 6,517,592 B1 | 2/2003 | Umotoy et al. | |
| 6,528,420 B1 | 3/2003 | Tong et al. | |
| 2003/0141016 A1 * | 7/2003 | Okase et al. | 156/345.29 |
| 2003/0164225 A1 * | 9/2003 | Sawayama et al. | 156/345.29 |

OTHER PUBLICATIONS

Water Cooled Traps, Nor-Cal Products, Yreka, CA (2 pages).

* cited by examiner

*Primary Examiner*—Robert A. Hopkins
(74) *Attorney, Agent, or Firm*—TraskBritt

(57) ABSTRACT

A trap device including at least one substance delivery element for introducing a substance therein is disclosed. The delivered substance may influence the nature of deposits that have formed within the trap device, may influence the formation of deposits within the trap device, or may cause a precipitate to form. Deposit interaction elements may be employed to influence the distribution or redistribution of deposits within the trap device. Deposit interaction elements may effect thermal conditions, introduce substances, or physically interact with deposits within the trap device. Further, a storage region within the trap device may be used to accumulate deposits. In one embodiment, a substantially continuous path through the trap device may be maintained or preserved so that deposits form within the trap device except substantially along the path. The present invention also encompasses a method of operation of a trap device as well as a system incorporating same.

139 Claims, 17 Drawing Sheets

PROCESS BYPRODUCT TRAP, METHODS OF USE, AND SYSTEM INCLUDING SAME

BACKGROUND OF THE INVENTION

1. Field of the Invention

The present invention relates generally to trap devices that reduce the volume of at least one undesired constituent present in gases passing therethrough and generally through an associated vacuum system.

2. State of the Art

The generic names for the devices that remove constituents from a gas stream are a trap, a cold trap, or a byproduct trap. Trap devices may be typically used in combination with vapor phase reaction processes, such as Chemical Vapor Deposition (CVD), including without limitation the application of CVD to so-called Atomic Layer Deposition (ALD), to remove undesirable constituents from the gas that is used to perform the vapor deposition as it is removed from the deposition chamber. More particularly, process gas may be removed from the treatment chamber, as part of a semiconductor manufacturing environment, by way of a vacuum pump or other vacuum source as known in the art. Thus, gases may be typically captured prior to reaching the vacuum pump by a trap device connected between the chamber outlet and the vacuum pump used to pump residue gases from the vacuum chamber. A primary reason for removing undesirable constituents from residual process gas prior to reaching the vacuum pump is to protect the vacuum pump from excessive wear, undesirable depositions on components thereof, chemical reactions with pump components, or other undesirable effects on the vacuum pump that may be caused by gases passing therethrough.

Of course, trap devices may be designed for treating specific exhaust gases that are derived from particular processes since different processes will use different processing gases and may exhibit different conditions. For instance, in semiconductor device fabrication, titanium films may be deposited by the general reaction between titanium tetrachloride and silane. Unfortunately, the titanium tetrachloride that does not react with silane to form titanium may be deleterious to the vacuum pump. Therefore, a trap device may commonly be used in semiconductor manufacturing CVD systems for removing titanium tetrachloride that exits the CVD chamber.

It is, therefore, to be expected that a variety of trap devices are available, whereby each type is aimed at a particular processing environment. These different types of trap devices may be configured for different constituents that may be contained in the exhaust gases, in different concentrations and for different responses of the exhaust gases to sudden cooling. Also, a number of chemical substances may be removed by passing the gases through a filter that removes these constituents without the benefit of a rapid change in temperature of the gases. However, removal of a target constituent is, in most cases, not so complete that the gases that have passed through a filter may not need further processing.

The principle that is most frequently used in the operation of trap devices is one of cooling a gas that is to be removed from a residual process stream, thus causing the gas to condense and accumulate inside the trap device. Of course, the trap device eventually fills with condensate residue which must then be removed by cleaning. Often, a trap device may be equipped with a series of tubes or baffles that are cooled and that intercept and contact the gases that flow through the trap device, thereby causing the gases to condense. One purpose of the tubes or baffles within the trap device is to cause the gas that passes through the device to be exposed to a particular reduced temperature over as long a period of time as possible. In so doing, the probability of collisions between gas molecules and the baffle or tube surfaces may be increased, leading to improved trapping efficiency for gases or other reaction by-products. However, by increasing the length of the path that the gases travel as they move through the trap device, it may require more frequent cleaning because the sizes of the apertures within the trap device that the gas passes through may be reduced prematurely. Stated another way, deposits may form unevenly within a trap device and constrict the passage of gases therethrough because of uneven temperature distributions within the trap device, or because there is more constituent material in the gas stream to be removed as the gas enters the trap than when the gas exits the trap, resulting in increased deposits near the inlet.

Thus, the deposits within a trap device may be distributed unevenly and passages through these devices may become plugged or obstructed by uneven distribution of deposits therein. Such uneven deposition of deposits within the trap device has undesirable effects. First, a substantial amount of capacity of the trap device may not be utilized because the uneven distribution of deposits may cause the trap device to become unusable before being completely full. Moreover, the trap device must be cleaned more often, which may particularly impact a manufacturing environment in lost manufacturing time. By way of example only, conventional trap devices may require cleaning after as few as 500 semiconductor wafers are processed through an associated process chamber such as a CVD chamber, which deficiency may provide an operational time for the system including the process chamber of as little as a day and a half before cleaning of the trap device is required.

FIGS. 1A and 1B show an exemplary, conventional trap device 10 generally defined by a cooling assembly 11 disposed within a cylindrical housing 22, with FIG. 1B depicting trap device 10 in a partially disassembled state, such as for cleaning. Top plate 28 may be removable from the cylindrical housing 22 and may be temporarily affixed thereto by bolts or a compression fitting and sealed thereto by an o-ring seal or as otherwise known in the art. Cooling assembly 11 may comprise tubing used to form cooling inlet 16 and cooling outlet 18 and cooling coils 20 therebetween. Cooled fluid or gas may be passed through the cooling inlet 16, cooling coils 20, and the cooling outlet 18 to remove heat from the conventional trap device 10. Chilled water or any other suitable fluid or gas may be used, as known in the art. As heat is removed from gases passing through conventional trap device 10, condensation and/or freezing of the gases may occur.

During operation, gases pass through the vacuum inlet 12 and are directed via inlet deflection plate 34 toward the outer diameter of the cylindrical housing 22. Gases then travel along the outer annulus 36 formed between outer deflection tube 24 that extend vertically downward from the inlet deflection plate 34 and the wall 42 of the cylindrical housing 22. Further, baffles 32 extending between the wall 42 of the cylindrical housing 22 and outer deflection tube 24 may cause the flow path of the gases passing thereby to be deflected radially as the gases move downwardly along outer annulus 36. Upon reaching the lowest extent of the outer deflection tube 24, the gases move into annulus 38 formed between outer deflection tube 24 and the vertical structure comprising the coils 20 and coil separation elements 30 and sealing element 31. Separation elements 30 may be installed between coils 20 for structural support, or, alternatively, the separation elements may be omitted by positioning coils 20 proximate to one another and then affixing the coils 20 to one another via brazing or as otherwise known in the art. Sealing element 31 may be configured to engage and seal against the bottom inner surface 44 of the cylindrical housing 22 as the top plate 28 and cooling assembly 11 are installed within the cylindrical housing 22. As gases travel through annulus 38 they may be deflected by way of baffles 32 that extend therein. Thus, gases may condense on the outer deflection tube 24, on the coils 20, and on the baffles 32 as the gases travel through and interact with the cooled surfaces thereof. In addition, as may be seen in FIG. 1A, the gases continue to the upper end of the coils 20, and then may move radially inwardly into annulus 40, also traveling along and around the baffles 32 that extend between the inner deflection tube 26 and the coils 20. Inner deflection tube 26 may be affixed to the cylindrical housing 22 at the bottom inner surface 44 and may be configured to engage and seal against the surface of outer deflection plate 34. Alternatively, the inner deflection tube 26 may be affixed to the inlet deflection tube 24 and removed therewith for cleaning, as depicted in FIG. 1B. Aperture 45 formed in inner deflection tube 26 allows gases to move through the trap device 10 and eventually exit the trap device 10 through vacuum outlet 14.

As is illustrated in FIG. 1C, deposits 13 may form within the trap device 10, on the baffles 32, the wall 42 of the cylindrical housing 22, the coils 20, the separation elements 30, and/or the sealing element 31, as well as on any surface within the trap device which interacts with the gases passing therethrough. Furthermore, deposits 13 may form unevenly, as shown in FIG. 1C. One reason for uneven distribution is that the cooling medium passing through the coils 20 may enter at a first temperature at the top of the trap device 10 and, as it passes through the coils 20, may be warmed as gases condense within the trap device 10. Therefore, the temperature of the coils 20 and baffles 32 attached thereto may be cooler near the inlet (top) of the trap device 10 than near the outlet (bottom) of the trap device 10. Thus, deposits 13 are shown as being relatively thick near the vacuum inlet 12 and top of outer annulus 36, as well as near the top of coils 20 between annulus 38 and annulus 40. As may be seen, the formation of deposits 13 may prevent the trap device 10 from functioning if the deposits reduce the ability of the vacuum inlet 12 to communicate with the vacuum outlet 14. Eventually, deposits may prevent communication between the vacuum inlet 12 and the vacuum outlet 14. As is further illustrated by FIG. 1C, uneven distribution of deposits 13 within trap device 10 may cause cleaning to become necessary after a relatively small volume of deposits forms within the trap device 10. Moreover, it may be seen that if deposits 13 were more evenly distributed within the trap device 10, the trap device 10 may require cleaning less frequently and may continue to operate to contain a greater amount of deposits 13 accordingly.

Of course, many different embodiments of conventional trap devices are possible, and FIGS. 1A–1C merely illustrate one such conventional design. Further, trap devices may be cooled by other means such as liquid nitrogen, dry ice, cooled gases, or thermoelectric devices as known in the art. In such configurations, normally, a vacuum chamber and a cooling chamber share a common wall, so that the cooling medium within the cooling chamber removes heat from the vacuum chamber, thus condensing and freezing the gases passing through the vacuum chamber.

As may be seen from FIGS. 1A–1C, the path of gases traveling through the conventional trap device 10 is intended to lengthen the path that the gases must traverse so that interaction time between the gases and the cooled surfaces within the conventional trap device 10 is increased and the gases may be condensed and thereby trapped more efficiently. However, as may also be seen by FIGS. 1A–1C, lengthening the path that the gases must follow decreases the relative cross-sectional area of the path that the gases must pass through for a given volume within a trap device. Thus, if the gases condense unevenly, the deposits 13 may accumulate and prevent gases from passing through the conventional trap device 10, thus necessitating removal of the cooling assembly 11 for cleaning. Uneven deposits 13 may be caused by any number of conditions such as the temperature distribution of the cooling assembly 11 and the cylindrical housing 22, the characteristics of the flow (such as turbulence) of the gases, as well as the distance along the path in relation to the vacuum inlet 12.

U.S. Pat. No. 6,241,793 B1 to Lee et al. discloses a curvilinear housing and a curvilinear cooling tube contained therein to reduce the frequency of cleaning of the cold trap. The cooling plate may also include a plurality of fins disposed thereon, generally facing the inlet of the housing, and spaced equidistantly from one another.

U.S. Pat. No. 6,206,971 B1 to Umotoy et al. discloses a temperature-controlled exhaust assembly with cold trap capability and multizone closed-loop temperature control. More specifically, as to the trap apparatus, Umotoy utilizes an external heater around the inlet of a cold trap to prevent buildup therein.

U.S. Pat. No. 6,528,420 B1 to Tong et al. discloses a double-acting cold trap including a deflecting plate that directs exhaust gases first over condensing fins and then over plates that are oriented perpendicular to the flow of the gases. The geometry and arrangement of the fins and plates are directed toward increasing the time between cleaning cycles by way of increasing the available area for condensate to be deposited.

BRIEF SUMMARY OF THE INVENTION

The present invention provides, in one embodiment, a trap device that may require cleaning less often than conventional trap devices. In one aspect of the invention, substance delivery elements are configured to deliver a substance within the trap device. More specifically, the substance delivered may influence the nature of deposits that have formed within the trap device or may influence the formation of deposits within the trap device from one or more constituents of the gas stream passing therethrough. Such substances may comprise catalysts to facilitate reactions of such constituents desirably removed from the gas stream. Alternatively, the substance may be designed to reduce or eliminate the presence of an undesired constituent passing through the trap device, or transform such undesired constituent to a more benign state.

For example, a substance may be delivered within the trap device at one or more locations to facilitate the formation of deposits. The substance may chemically react with a gas or gases passing through the trap device to form a precipitate or may react with a gas or gases passing through the trap device to form another gas or gases that are more desirable, or less undesirable, in nature. Alternatively or additionally, a cooled substance may be delivered within the trap device to encourage the formation of deposits.

In another aspect of the embodiment providing substance delivery, a substance may be delivered within the trap device to cause a deposit therein to be distributed within the trap device. For instance, a deposit solvent may be delivered within the trap device and may cause a deposit within the trap device to form a solution to be distributed within the trap device. Of course, thermal energy may be delivered via a substance that is delivered within a trap device as well.

Furthermore, a substance delivery element may be movable within the trap device. Moreover, a substance delivery element may be configured to prevent or remove deposits forming thereon, via mechanical, thermal, or chemical techniques, so that the substance delivery element does not become blocked so as to interfere with delivery of a substance thereby. Accordingly, a substance delivery element may also include valves, nozzles, atomizers, or other devices known in the art for substance delivery, distribution and control. Also, a substance delivery element may be used to maintain a substantially continuous path through the trap device.

In another embodiment of the present invention, a trap device may include thermal elements for interacting with deposits therein. Thermal elements may comprise heating elements or cooling elements, or may be configured to both heat and cool. Thermal elements may be configured as heat transfer elements and may comprise thermoelectric devices.

Heating as well as cooling may be effected within a trap device via thermal elements. Generally, heat may be used to remove as well as prevent deposits from forming within the trap device, while removing heat (cooling) may facilitate as well as encourage deposits to form within the trap device.

Thermal elements may be controlled according to empirical or modeling data concerning trap device operation, by way of measurement devices, or by both techniques. Thus, thermal elements may be configured to respond to the deposits forming within the trap device to distribute same within the trap device via measurement devices. The present invention contemplates that measurement devices may be used with any of the embodiments of the present invention, including substance delivery elements or mechanical elements as well.

In a further aspect of the present invention, a trap device may include movable elements that interact with deposits therein. More specifically, movable elements may push, pull, cut, scrape, shear, deform, or otherwise mechanically interact with deposits that form within the trap device. In addition, the trap device may include a storage region that is configured to extend the time between required cleanings of the trap device. Additionally, a storage region within a trap device may be used in combination with any of the embodiments of the present invention.

As another aspect of the present invention, a substantially continuous path through the trap device may be maintained or preserved so that deposits form within the trap device except substantially along the path. Thus, the path that is maintained or preserved allows the trap device to function while distributing deposits within the trap device. An energy beam such as a laser beam may be used to maintain the path through the trap device in an open state or to reopen an occluded path. Of course, features and elements of the aforementioned embodiments may also be configured and operated to maintain or preserve the substantially continuous path.

As still another aspect of the present invention, the trap device may be configured to operate in one or more modes of operation so as to be filled with deposits of constituents removed from the gas stream passing therethrough in a substantially uniform manner to maximize the utility of the internal volume of the trap device to accumulate deposits before the trap device is cleaned.

The present invention also encompasses methods of operation of a trap device as well as systems employing same.

DETAILED DESCRIPTION OF THE ILLUSTRATED EMBODIMENTS

Figure 1A:
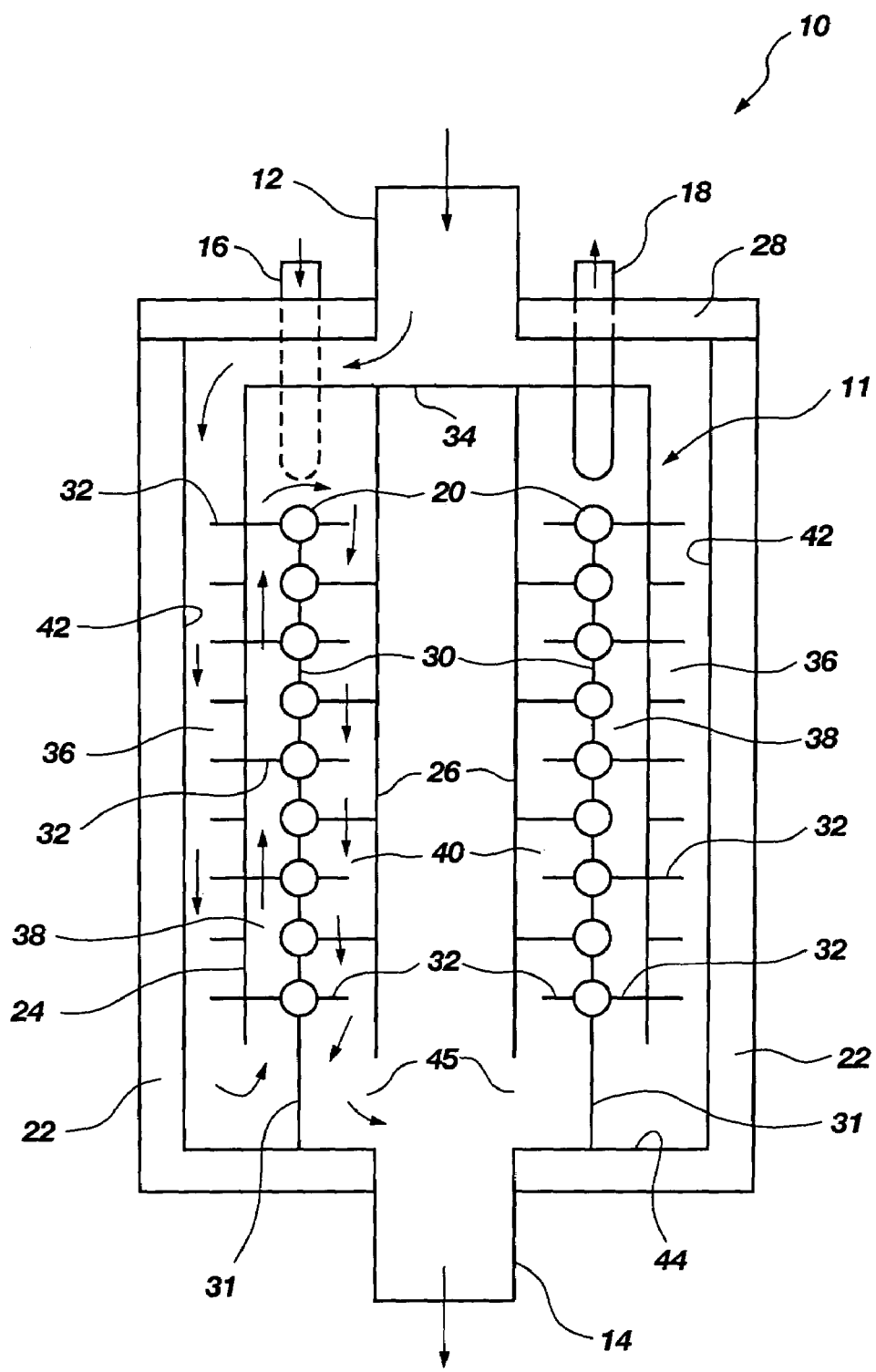
FIG. 1A is a partial side cross-sectional view of a conventional trap device.
Figure 2A:
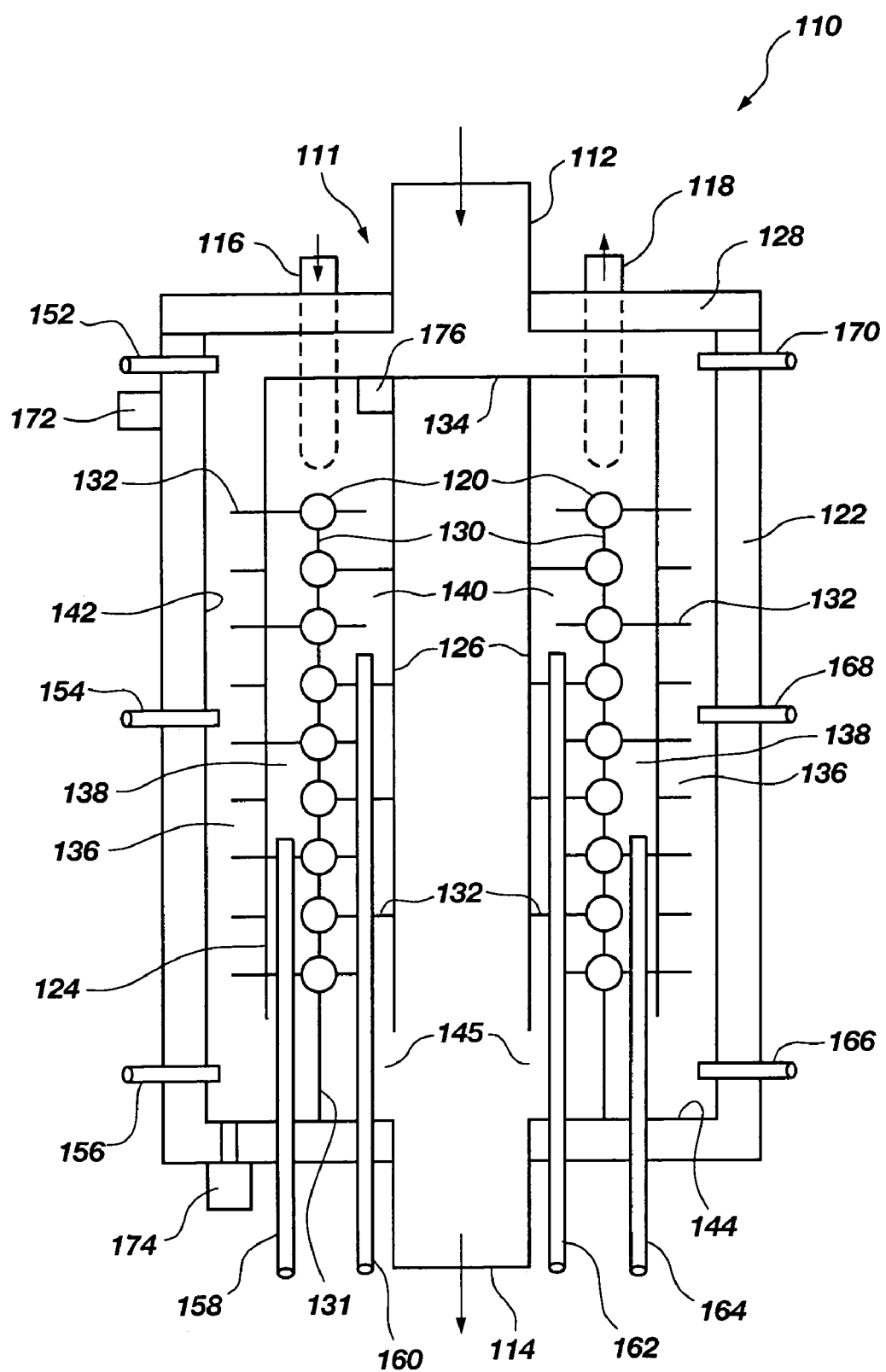
FIG. 2A is a side cross-sectional view of an embodiment of a trap device of the present invention including substance delivery ports.
Figure 2B:
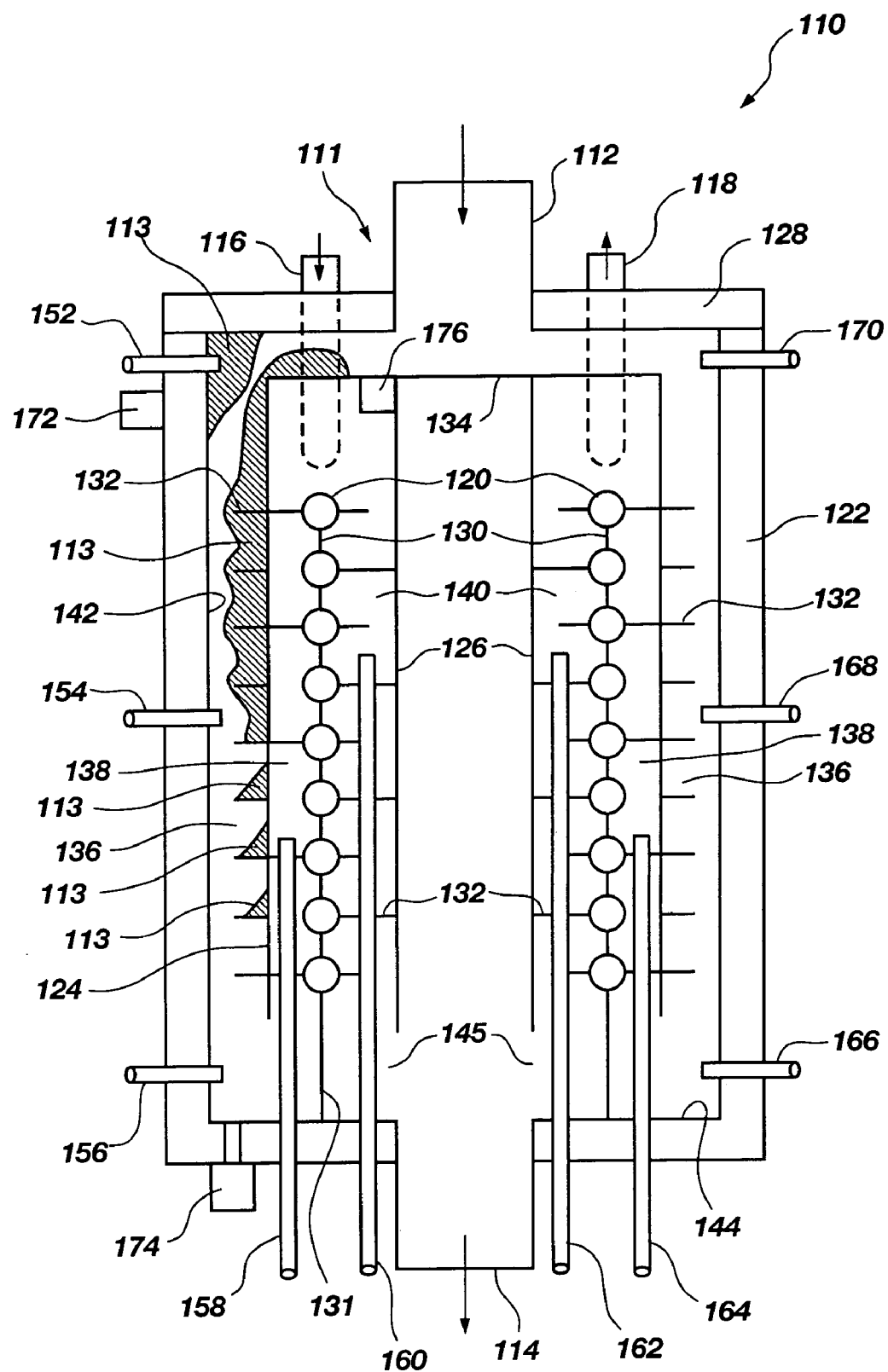
FIG. 2B is a side cross-sectional view of the embodiment of a trap device of the present invention as shown in FIG. 2A during operation.
Figure 2C:
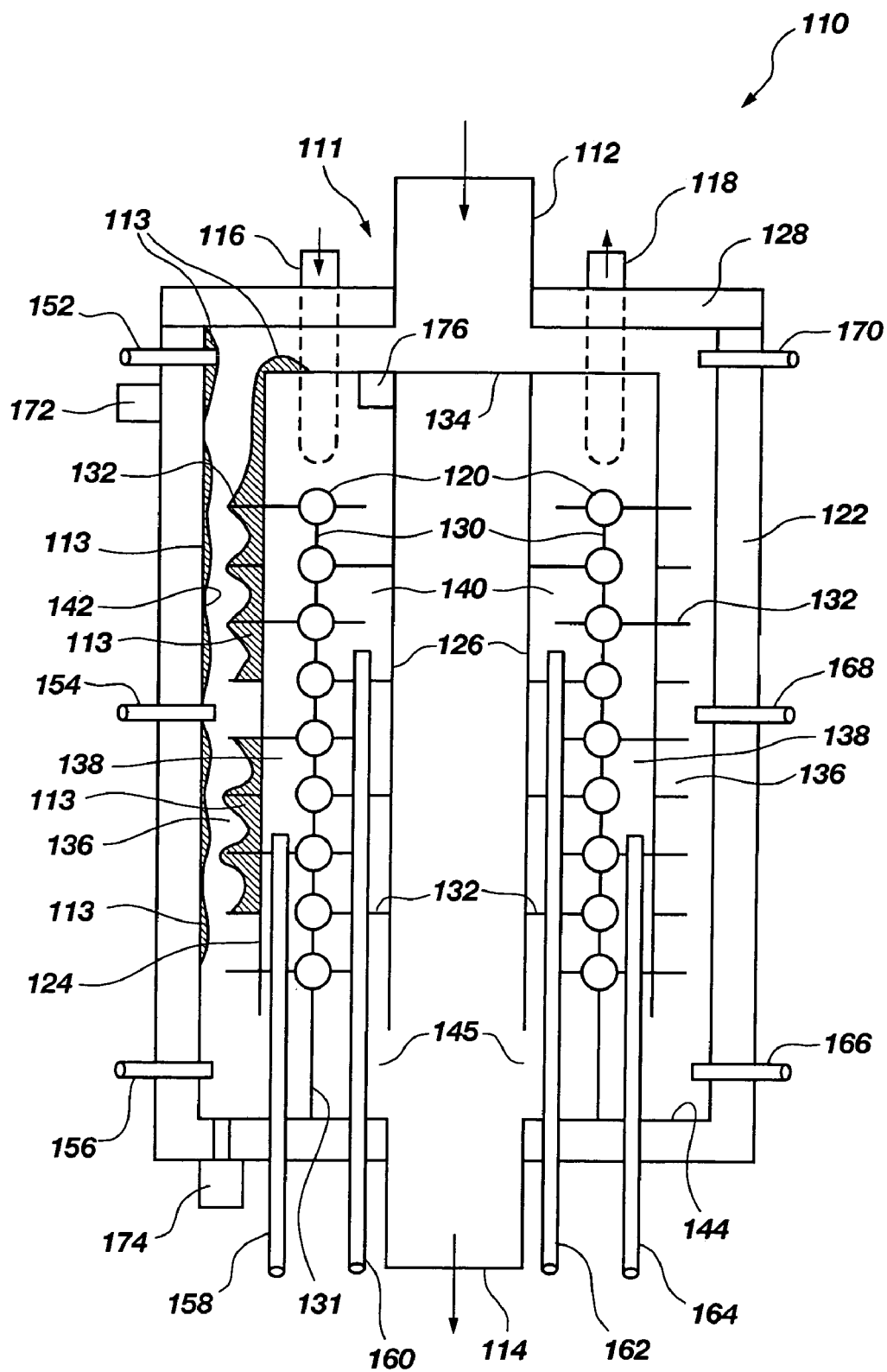
FIG. 2C is a side cross-sectional view of the embodiment of a trap device of the present invention as shown in FIG. 2A during operation.

FIGS. 2A–2C show an exemplary embodiment of a trap device 110 of the present invention wherein trap device 110 includes cooling assembly 111 disposed within a cylindrical housing 122. Similar to the conventional trap device 10 shown in FIG. 1A, top plate 128 may be removable from the cylindrical housing 122 and may be temporarily affixed thereto by bolts or a compression fitting and sealed thereto by an o-ring seal or other sealing configuration as known in the art. Cooling assembly 111 may comprise tubing that forms cooling inlet 116, cooling outlet 118, and cooling coils 120 therebetween for conducting cooled fluid or gas therethrough to remove heat from the trap device 110. Chilled water or any other suitable fluid or gas that may be desired may be used, as known in the art.

During operation of trap device 110, gases pass through the vacuum inlet 112 and are directed via inlet deflection plate 134 toward the outer diameter of the cylindrical housing 122. Gases then travel along the outer annulus 136 formed between outer deflection tube 124 that extends vertically downward from the inlet deflection plate 134 and the wall 142 of the cylindrical housing 122. Further, baffles 132 extending between the wall 142 of the cylindrical housing 122 and outer deflection tube 124 may cause the flow path of the gases passing thereby to be deflected radially as the gases move downwardly along outer annulus 136. However, delivery ports 152, 154, and 156 extend into outer annulus 136 at various vertical positions along the wall 142 of the cylindrical housing 122. Also, delivery ports 166, 168, and 170 may be positioned along the circumference of the wall 142 of cylindrical housing 122. Of course, other delivery ports may be positioned within annulus 136 as is desired. Delivery ports 158 and 164 may be disposed within annulus 138 as shown. Similarly, delivery ports 160 and 162 may be disposed within annulus 140.

During operation of trap device 110, delivery ports 152, 154, 156, 158, 160, 162, 164, 166, 168, and/or 170 may be used to deliver a substance to the interior of the trap device 110. Delivery of a substance to the interior of the trap device 110 may serve a number of functions. For instance, delivery of a substance via delivery ports 152, 154, 156, 158, 160, 162, 164, 166, 168, and/or 170 may cause gases interacting therewith to form solid or liquid precipitates. One such method of forming a precipitate may include a chemical that, when reacting with a gas within the trap device 110, forms a precipitate. Specifically, concerning the deposition of titanium, as mentioned hereinabove, titanium tetrachloride may be used or produced in the semiconductor manufacturing process. Also, it is known in the art that water and titanium tetrachloride may react to form hydrochloric acid and titanium dioxide. Ammonia may be used to react with hydrochloric acid to form ammonia chloride. Therefore, in a semiconductor manufacturing environment, it may be advantageous to deliver ammonia and/or water via one or more delivery ports to cause the precipitation of a gas passing therethrough. Of course, there are a multitude of chemical reactions that may cause precipitates to form and the present invention is not limited to any particular chemical configuration. In another embodiment, the delivery ports may be used to deliver a supercooled substance within the trap device 110, thus causing deposits to form.

Alternatively, delivery of a substance via delivery ports 152, 154, 156, 158, 160, 162, 164, 166, 168, and/or 170 may cause deposits within the trap device 110 to transform to a liquid or gaseous (including vapor) state so that the deposits may be arranged or distributed in a more beneficial pattern within the trap device 110. For instance, in an area where deposits form in a greater amount in comparison to other areas within the trap device 110, delivery of a substance via delivery ports 152, 154, 156, 158, 160, 162, 164, 166, 168, and/or 170 may cause the deposits to be more uniformly distributed within the trap device 110. Referring to titanium tetrachloride, solvents therefor such as water, alcohol, or dilute hydrochloric acid may be delivered to distribute titanium tetrachloride deposits.

For instance, as shown in FIG. 2B, deposits 113 may form preferentially near the top of outer annulus 136 prior to use of delivery ports 152, 154, 156, 158, 160, 162, 164, 166, 168, and/or 170. Such deposits 113 are undesirable because the trap device 110 may require cleaning prematurely in that much of the capacity of the trap device 110 to store deposits 113 may be unused. Therefore, delivery ports 152 and/or 154 may be used to introduce a substance in the region proximate thereto, so as to distribute deposits 113. FIG. 2C shows the trap device 110 of FIG. 2B subsequent to introduction of a substance via delivery ports 152 and/or 154. As shown in FIG. 2C, such use of delivery ports 152 and/or 154 may cause deposits 113 to be distributed within outer annulus 136.

Since deposits 113 may form upon delivery ports 152, 154, 156, 158, 160, 162, 164, 166, 168, and/or 170 (as shown in FIG. 2B), each or any of the delivery ports may be configured with the capability to be heated so that such deposits do not interfere with the delivery of a substance thereby. In addition, movement of delivery ports may be effected via movable stages within the trap device 110. Such a configuration may enable the delivery ports 152, 154, 156, 158, 160, 162, 164, 166, 168, and/or 170 to be effective over a greater area within the trap device 110, thus reducing the number of delivery ports required. Of course, movable delivery ports may be configured to articulate, rotate, or otherwise translate within the trap device 110, may be automatically controlled or manually controlled, and may be operated at predetermined intervals, manually or responsive to some condition within trap device 110. For example, measurement devices 172, 174, and 176 may be used to indicate the relative amount of deposits within a particular area of the trap device 110 by determining the thickness of such deposits. Measurement devices 172, 174, and 176 may thus comprise deposit thickness measurement devices as known in the art, such as devices employing reflected or refracted light or ultrasonic waves, or electrical resistance, or visual inspection devices such as borescopes for allowing visual inspection of the trap device deposits. Other deposit measurement devices may include weight, flow rate, pressure drop, mass flow into the trap device 110, mass flow out of the trap device 110, and resistance to flow through trap device 110, or other measurements indicative of a characteristic of the deposits therein. As shown in FIGS. 2A–2D, measurement devices 172, 174, and 176 may be configured to measure a characteristic of a deposit from outside the cylindrical housing 122, through or partially through the cylindrical housing 122, or within the cylindrical housing 122, or otherwise as may be desirable. Measurement of the thickness of deposits through the cylindrical housing 122 may be advantageous because some measurement technologies may not function in a vacuum environment, such as noncontact ultrasonic measurement devices. Further, the measurement devices may be configured to measure a condition within the cylindrical housing 122, such as temperature, concentration of a gaseous constituent passing therethrough, temperature therein, or other operational condition within the cylindrical housing 122.

The delivery ports 152, 154, 156, 158, 160, 162, 164, 166, 168, and/or 170 may be selectively positioned according to observation of uneven distribution of deposits within the trap device 110 upon repeated use thereof. In addition, the delivery ports 152, 154, 156, 158, 160, 162, 164, 166, 168, and/or 170 may comprise delivery points, such as nozzles, or may comprise delivery areas, such as along a portion of the length of the delivery port. For instance, delivery port 160 may be perforated along its length extending within annulus 140 so that upon delivery, substance may be distributed therealong.

Moreover, delivery ports 152, 154, 156, 158, 160, 162, 164, 166, 168, and/or 170 may be configured to deliver a substance according to delivery technology as known in the art, and may include delivery control devices such as nozzles, atomizers, and/or valves for adjusting, directing, controlling and regulating a substance exiting a given delivery port. For example, as shown in FIG. 2E, directed toward delivery of a fluid or gas, pump 186 may provide pressure for delivering the fluid or gas through delivery port 180, control device 188, and control device 182. Alternatively, pump 186 may be configured as a reservoir in the case that a pressure below atmospheric pressure within a trap device wherein the delivery port 180 is disposed may act as the impetus to cause movement of a gas or fluid. Delivery control devices 182 and 188 may be configured for controlling the rate and direction of a gas or fluid passing therethrough. Delivery control device 182 may comprise a nozzle or atomizer having an aperture 184, wherein a characteristic of the gas or liquid exiting therethrough may be altered, such as shape, flow rate, and direction of the exiting gas or liquid stream. Delivery control devices 182 and 188 may also be adjustable and may comprise a single control device that functions to alter a characteristic of the gas or liquid exiting therethrough. Thus, delivery control device 182 may comprise a nozzle, atomizer, and/or valve for adjusting, directing, controlling and regulating a substance exiting a given delivery port, as mentioned hereinabove.

Thus, as may be seen in FIGS. 2A–2C, gases may move along the lower extent of the outer deflection tube 124 and into annulus 138 formed between outer deflection tube 124 and the vertical structure comprising the coils 120 and coil separation elements 130 and sealing element 131. Sealing element 131 may be configured to engage and seal against the bottom inner surface 144 of the cylindrical housing 122 as the top plate 128 and cooling assembly is installed within the cylindrical housing 122. Accordingly delivery ports 156 and 166 may cause deposits 113 to form or to be distributed away from the area proximate to the bottom inner surface 144 of the cylindrical housing 122, the sealing element 131, and the bottom end of the outer deflection tube 124.

Separation elements 130 may be installed between coils 120 for structural support, or, alternatively, the separation elements may be omitted by positioning coils 120 proximate to one another and then affixing the coils 120 to one another via brazing or as otherwise known in the art. As gases travel through annulus 138, they may be deflected by way of baffles 132 that extend therein. Thus, gases may condense on the outer deflection tube 124, on the coils 120, and on the baffles 132 as the gases travel through and interact with the cooled surfaces thereof. Delivery ports 158 and 164 may deliver a substance within annulus 138 to either cause deposits to form therein or the substance may cause deposits to be redistributed therein or removed therefrom.

In addition, as may be seen in FIG. 2A, the gases continue to the upper end of the coils 120, and then may move radially inwardly into annulus 140, also traveling along and around the baffles 132 that extend between the inner deflection tube 126 and the coils 120. As shown in FIG. 2A, delivery ports 160 and 162 extend into annulus 140 formed between inner deflection tube 126 and the coils 120. It may be desirable to configure delivery ports 160 and 162 to extend vertically away from the vacuum outlet 114 to prevent the substance injected therefrom to exit the vacuum outlet 114.

Inner deflection tube 126 may be affixed to the cylindrical housing 122 at the bottom inner surface 144 of the cylindrical housing 122 and may be configured to engage and seal against the surface of inlet deflection plate 134. Such a configuration may improve the cleaning of the coils 120 when they are removed from the cylindrical housing 122 because the inner deflection tube 126 remains within the trap device 110 and the inner surface of the coils 120 removed with the cooling assembly 111 and likely covered with deposits may be cleaned. Apertures 145 allow gases to move through the trap device 110 and eventually exit the trap device 110 through vacuum outlet 114. Alternatively, the inner deflection tube 126 may be affixed to the inlet deflection plate 134 and removed therewith for cleaning.

Figure 6:
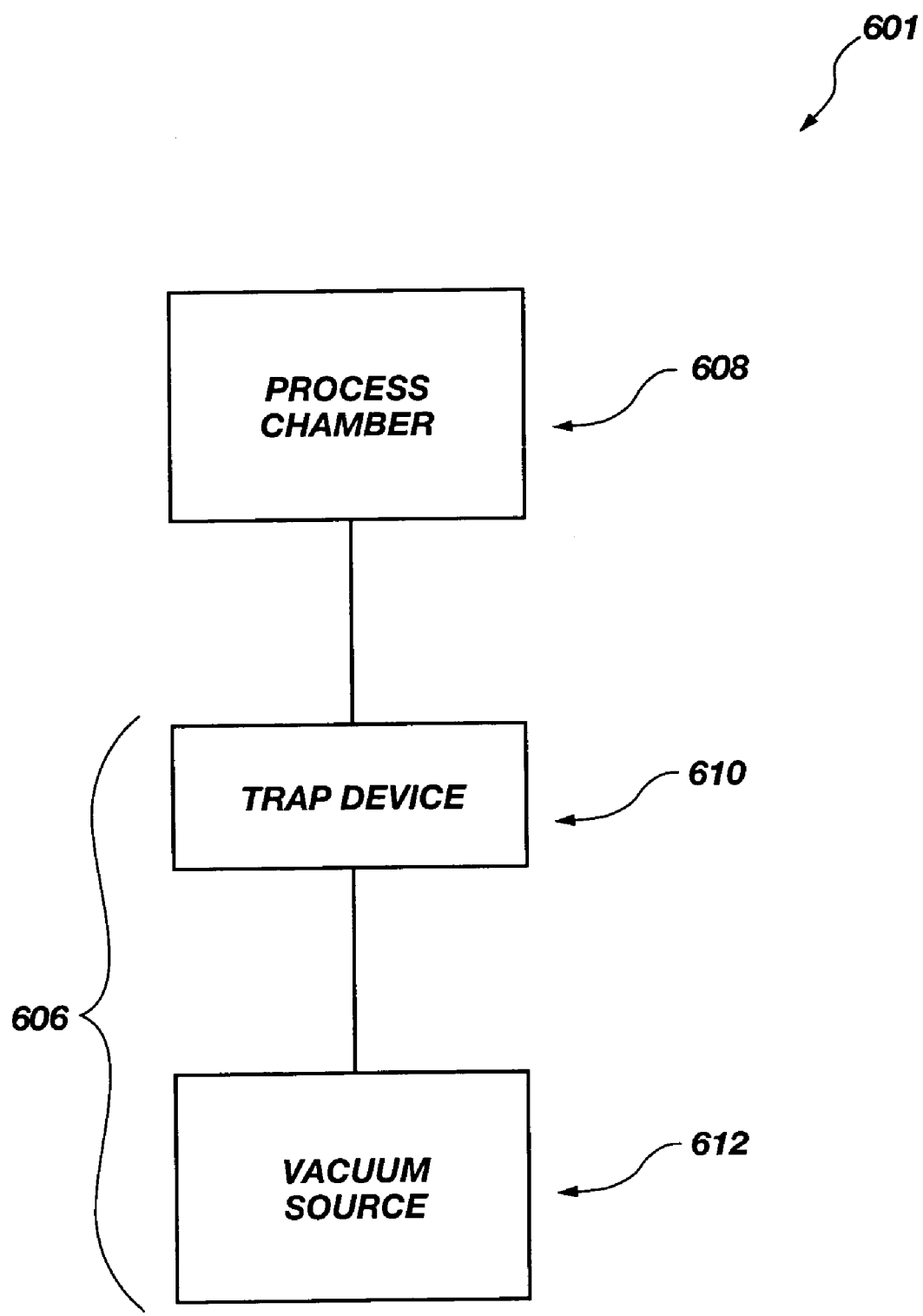
FIG. 6 shows a schematic representation of a system incorporating an embodiment of a trap device of the present invention.

Further, delivery ports 152, 154, 156, 158, 160, 162, 164, 166, 168, and/or 170 may be used to beneficially cause the formation of deposits within trap device 110. As is known in the art, different gases exhibit different properties with respect to their propensity to form condensate, or in chemical reactivity. Therefore, it may be advantageous to deliver a substance within the trap device 110 that chemically reacts with and thereby causes gases to form a precipitate. For instance, some gases may resist condensing within a trap device 110 and may pass through the trap device 110, causing damage to a vacuum source 612 as shown in FIG. 6. FIG. 6 shows one example of a system 601 including a process chamber 608, a trap device 610, and a vacuum source 612. The trap device 610 and the vacuum source 612 comprise a vacuum system 606. Process chamber 608 and vacuum system 606 may be employed in any number of different contexts, such as CVD, ALD, and other chemical processes. Vacuum source 612 removes gases from the process chamber 608 through the trap device 610, thereby also removing gases from the trap device 610. Vacuum source 612 may comprise any vacuum-generating technology as known in the art, without limitation.

Figure 2D:
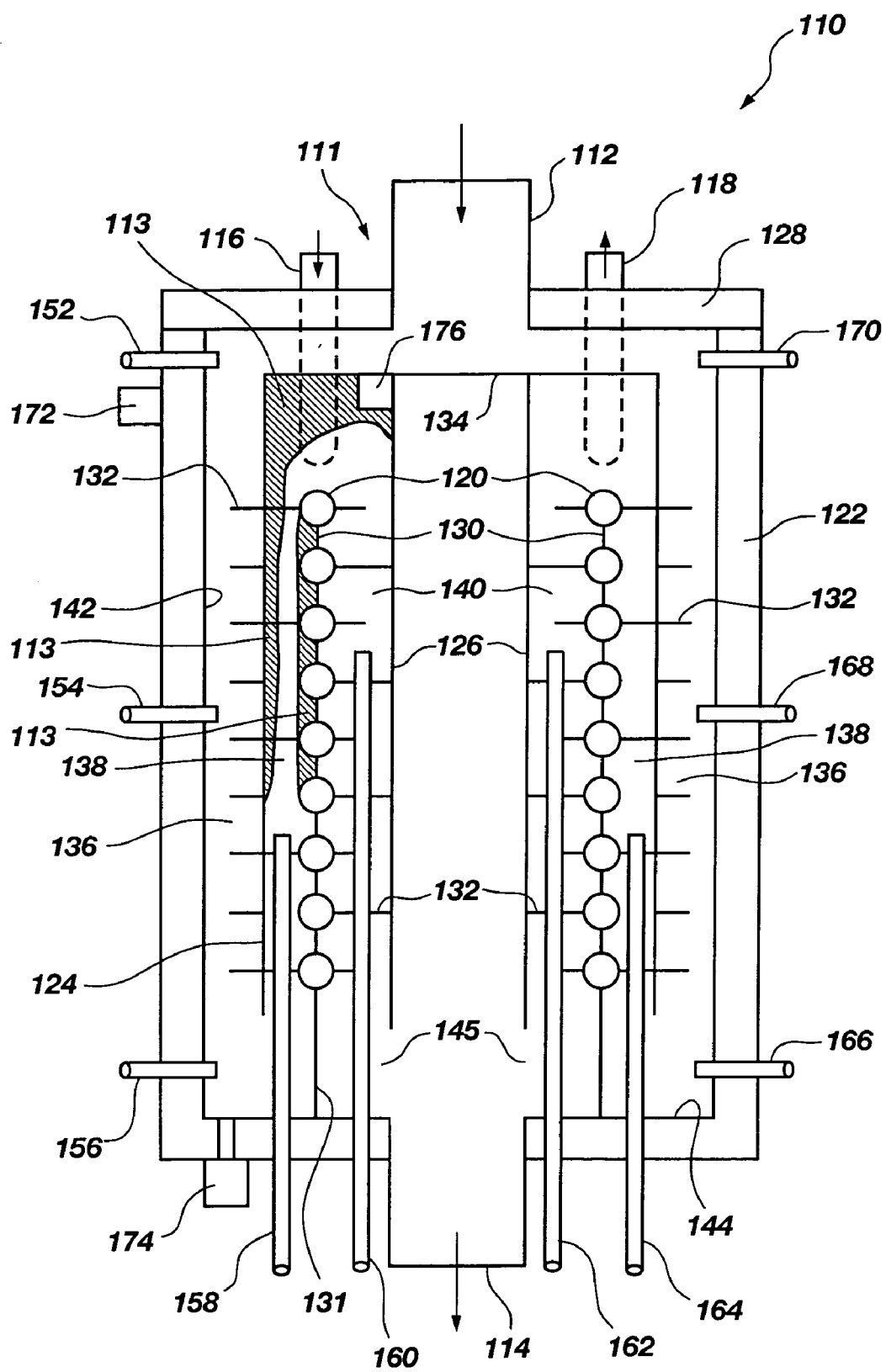
FIG. 2D is a side cross-sectional view of the embodiment of a trap device of the present invention as shown in FIG. 2A during operation.
Figure 2E:
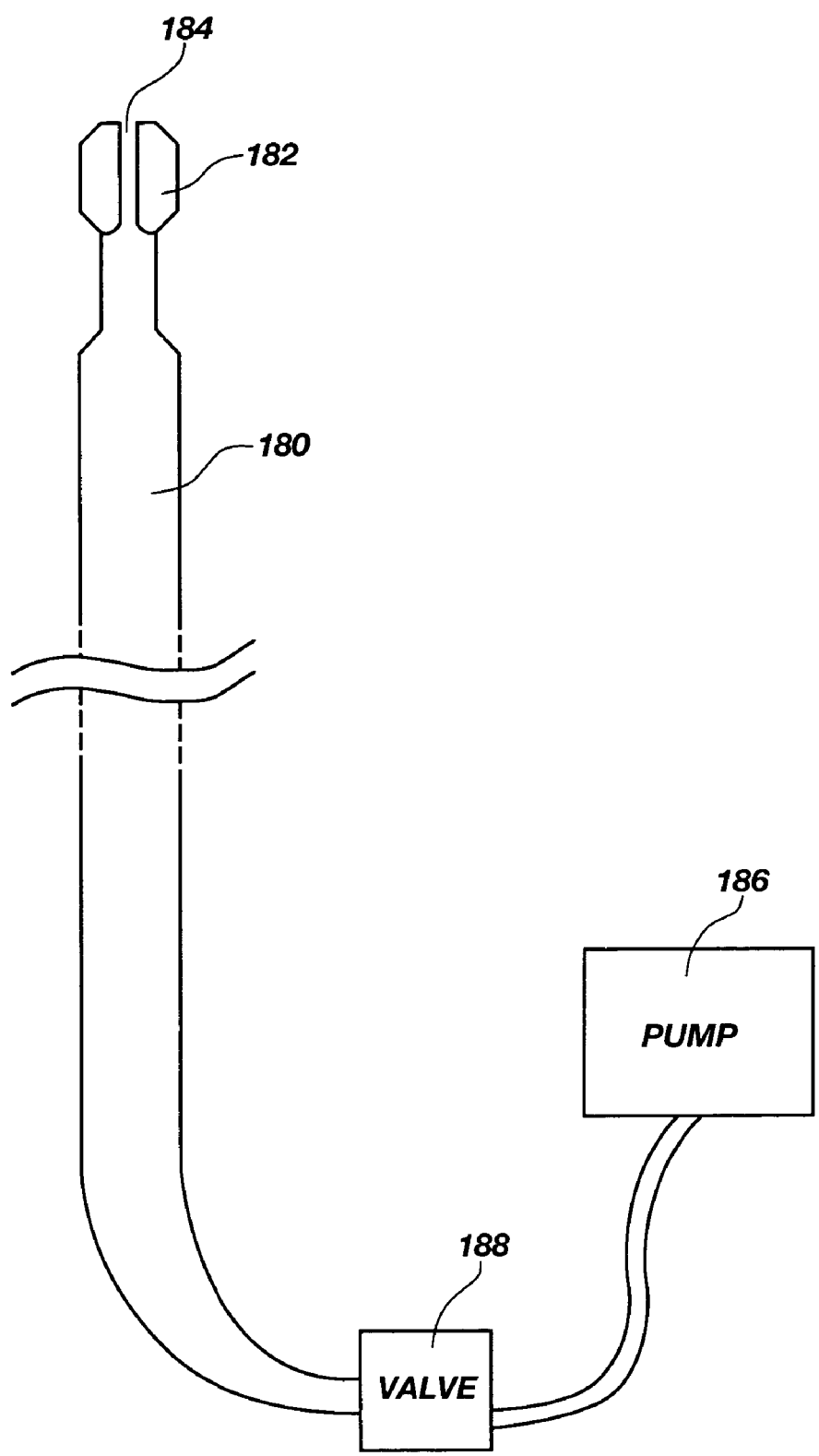
FIG. 2E is a side cross-sectional schematic view of a delivery port in accordance with the present invention.

FIG. 2D shows the trap device of FIG. 2C, wherein delivery port 158 delivers a substance that causes deposits to form within annulus 138. As mentioned above, the substance may be altered to react with a known gas passing through the trap device 110. Such gases may be known as reactants or byproducts in a process, such as a semiconductor manufacturing process, or other process as known in the art. Alternatively, a substance that cools the interior of the trap device 110 and/or the gases passing therethrough may be used to cause deposits to form. One such substance may be liquid nitrogen, but any liquid, gas, or solid that is colder than the region of the trap device 110 to which it is introduced may be used. Alternatively, endothermic chemical reactions may be employed to remove heat from gases passing through a trap device and/or to cause the formation of a precipitate. "Precipitate," as used herein, means a liquid or solid that is chemically formed at least partially from a gas. As a further aspect of introducing substances within a trap device, it may be advantageous to introduce a substance that may react with a gas passing through the trap device 110, thus forming another gas or gases that are relatively more benign or compatible with the equipment/process being used, or forming a liquid or a solid.

It may be seen that in particular regions of a trap device 110, it may be desirable to lessen the amount of deposits 113 while in other areas of the trap device 110 it may be desirable to increase the amount of deposits 113. Accordingly, delivery ports may be used to introduce different substances within different regions of the trap device 110. Further, it may be desired to prevent certain gases from passing through the trap device 110 without regard to the amount of deposits 113 forming therein. Although the delivery ports 152, 154, 156, 158, 160, 162, 164, 166, 168, and/or 170 have been shown as being installed within the cylindrical housing 122, the present invention is not so limited. The present invention contemplates that delivery ports may be disposed at any position within a trap device 110.

As in any embodiments that deliver a substance to the interior of a trap device, because trap devices are often used as part of a process that may depend on a particular magnitude of vacuum gage pressure, care may be exercised so that the amount of vacuum gage pressure is not influenced adversely. Particularly, delivery of a substance to the interior of a trap device may cause the magnitude of vacuum gage pressure to change. Such a change in the vacuum gage pressure may be analogous to a vacuum leak, where the magnitude of the vacuum gage pressure may be reduced, meaning the relative pressure increases within the vacuum system. Therefore, the rate that a substance is delivered to the interior of a trap device may be limited so that the magnitude of vacuum gage pressure does not fall below a selected magnitude. Adjustable valves or other control devices as known in the art may be used to control the rate that a substance is delivered to the interior of a trap device.

Figure 3A:
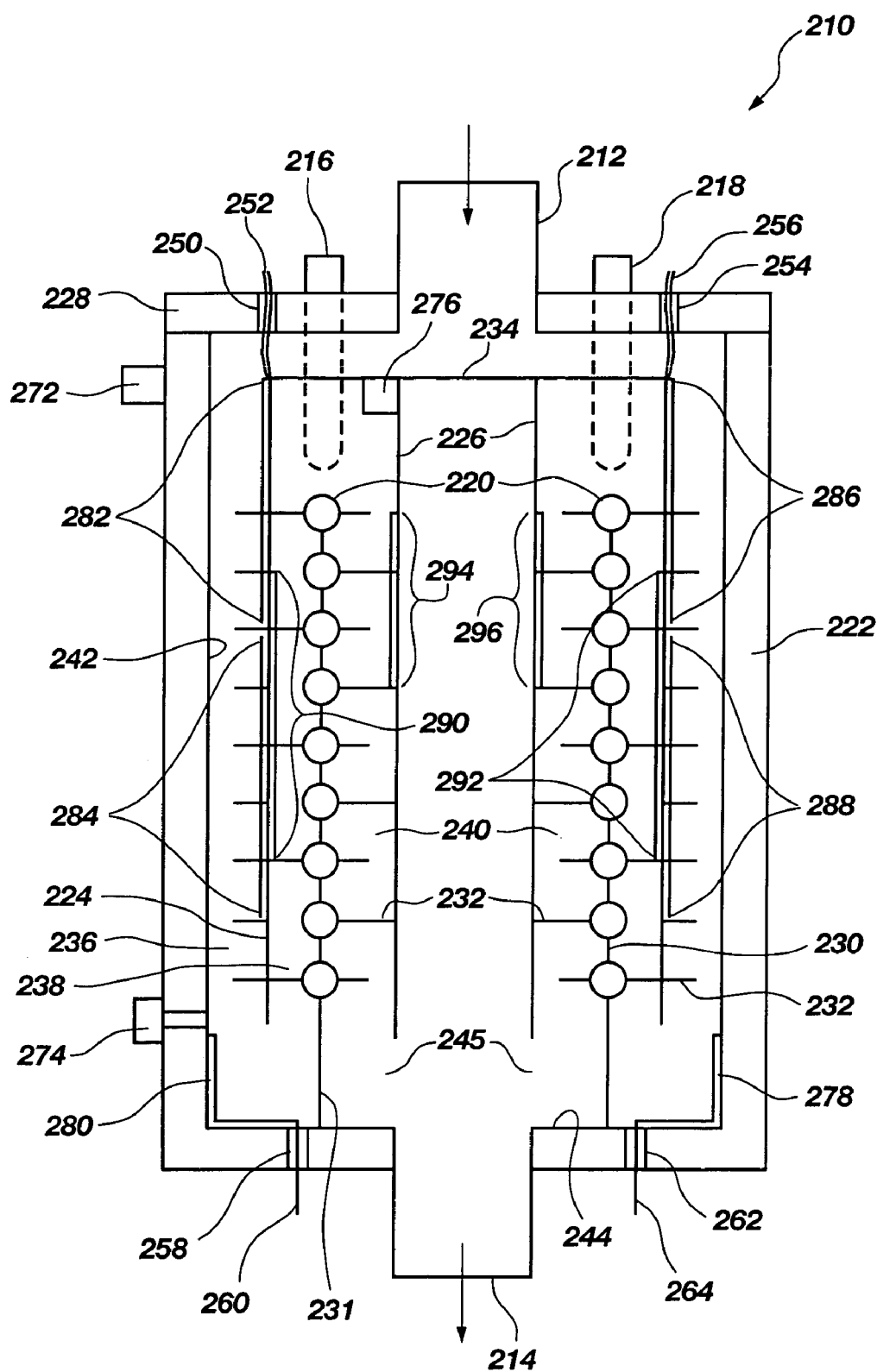
FIG. 3A is a side cross-sectional view of another embodiment of a trap device of the present invention including heating elements.
Figure 3B:
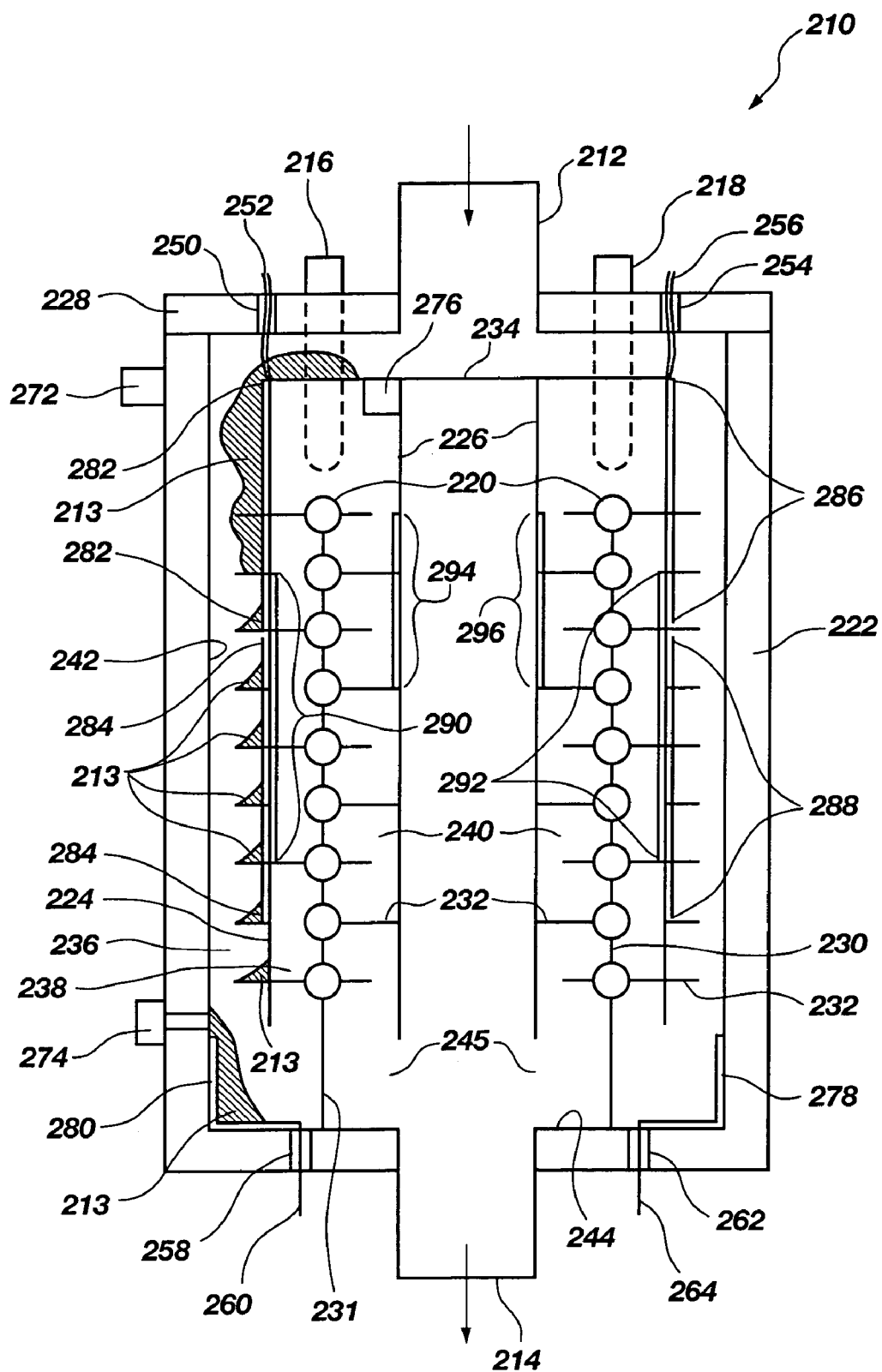
FIG. 3B is a side cross-sectional view of the embodiment of a trap device of the present invention as shown in FIG. 3A during operation.

As another aspect of the present invention, thermal elements 278, 280, 282, 284, 286, 288, 290, 292, 294, and 296 may be used within a trap device 210 to distribute deposits 213 therein. FIGS. 3A–3B show an embodiment of a trap device 210 of the present invention wherein thermal elements 278, 280, 282, 284, 286, 288, 290, 292, 294, and 296 are disposed within the interior of the trap device 210 so that deposits 213 may be beneficially caused or facilitated, inhibited, or otherwise distributed or redistributed within the trap device 210. Thermal elements 278, 280, 282, 284, 286, 288, 290, 292, 294, and 296 may be configured to generate, deliver, and/or transfer heat energy to the interior of the trap device 210 or may be configured to remove and/or transfer heat energy from the interior of the trap device 210. Thermal elements 278, 280, 282, 284, 286, 288, 290, 292, 294, and 296, accordingly, may comprise heating or cooling structures or configurations, structures or configurations which are reversible between heating and cooling modes, or heat transfer structures or configurations. Thermal elements 278, 280, 282, 284, 286, 288, 290, 292, 294, and 296 may comprise, without limitation, thermoelectric devices.

Heating and cooling configurations include any and all heating and cooling technologies as known in the art. Thermoelectric devices, as also known in the art, operate on the Peltier effect, which is the heating and cooling effect that occurs when electric current passes through two dissimilar conductors. An exemplary thermal element may comprise a thermoelectric device including an array of paired p- and n-type semiconductor elements that act as the two dissimilar conductors, although the invention is not so limited. As electric current passes through one or more pairs of semiconductor elements, there is a decrease in temperature at the junction ("cold") surface resulting in the absorption of heat from the surrounding environment. The heat is transferred through the thermoelectric device by electron transport and released on the opposite ("hot") surface as the electrons move from a high to low energy state. Thus, the heat may be transferred from one surface of a thermoelectric device to another surface of the thermoelectric device. Depending on the function to be accomplished by the thermoelectric device, one or more surfaces of the thermoelectric device may be configured to transfer heat to the fluid moving through the coils within the trap device. Also, as known in the art, the potential of the electric current may be reversed, causing a reversal in the direction of the heat transfer. The heat pumping capacity of a thermoelectric device is proportional to the current and the number of pairs or couples of n- and p-type elements.

Where thermal elements 278, 280, 282, 284, 286, 288, 290, 292, 294, and 296 are configured to generate heat within the trap device 210, vacuum feedthroughs 250, 254, 258, and 262 may contain conduits 252, 256, 260, and 264, respectively comprising wires that conduct electrical power as well as thermocouple signal transmission. Where thermal elements 278, 280, 282, 284, 286, 288, 290, 292, 294, and 296 are configured to remove heat from within the trap device 210, conduits 252, 256, 260 and 264 may comprise tubes for conducting a cooled medium. Further, where the thermal elements are configured as thermoelectric devices, conduits 252, 256, 260 and 264 may comprise wires that conduct electrical power and/or thermocouple signal transmission. Typically, vacuum feedthroughs 250, 254, 258, and 262 may comprise a threaded fitting having an aperture therethrough wherein the conduits 252, 256, 260, and 264 are passed through the aperture and the aperture is potted with a material that hardens therearound, thus forming a vacuum-tight seal. Alternatively, conduits 252, 256, 260, and 264 may comprise separate welded apertures or other conduit elements as known in the art.

Figure 1B:
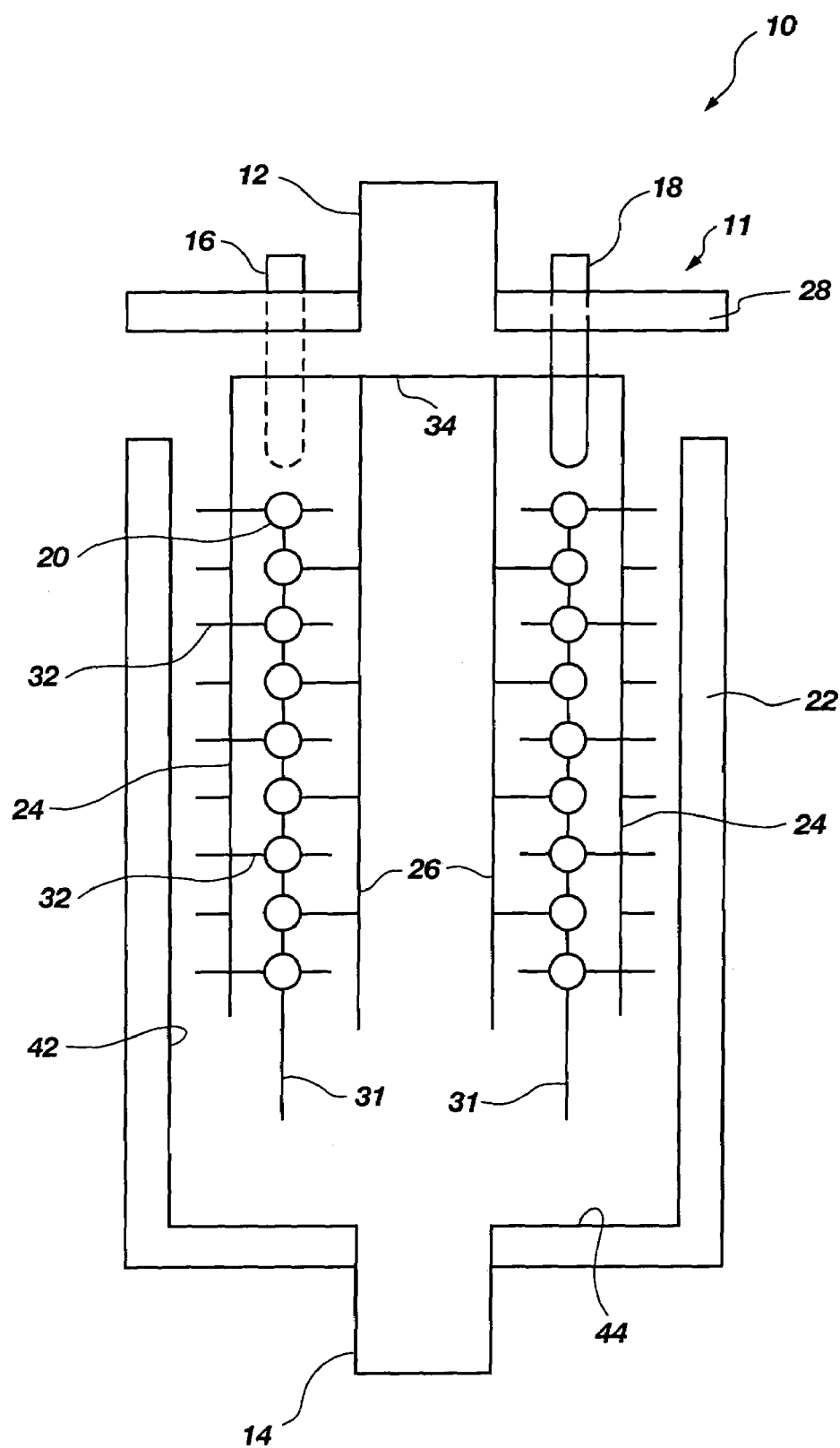
FIG. 1B is a partial side cross-sectional view of the conventional trap device shown in FIG. 1A in a partially disassembled state.
Figure 1C:
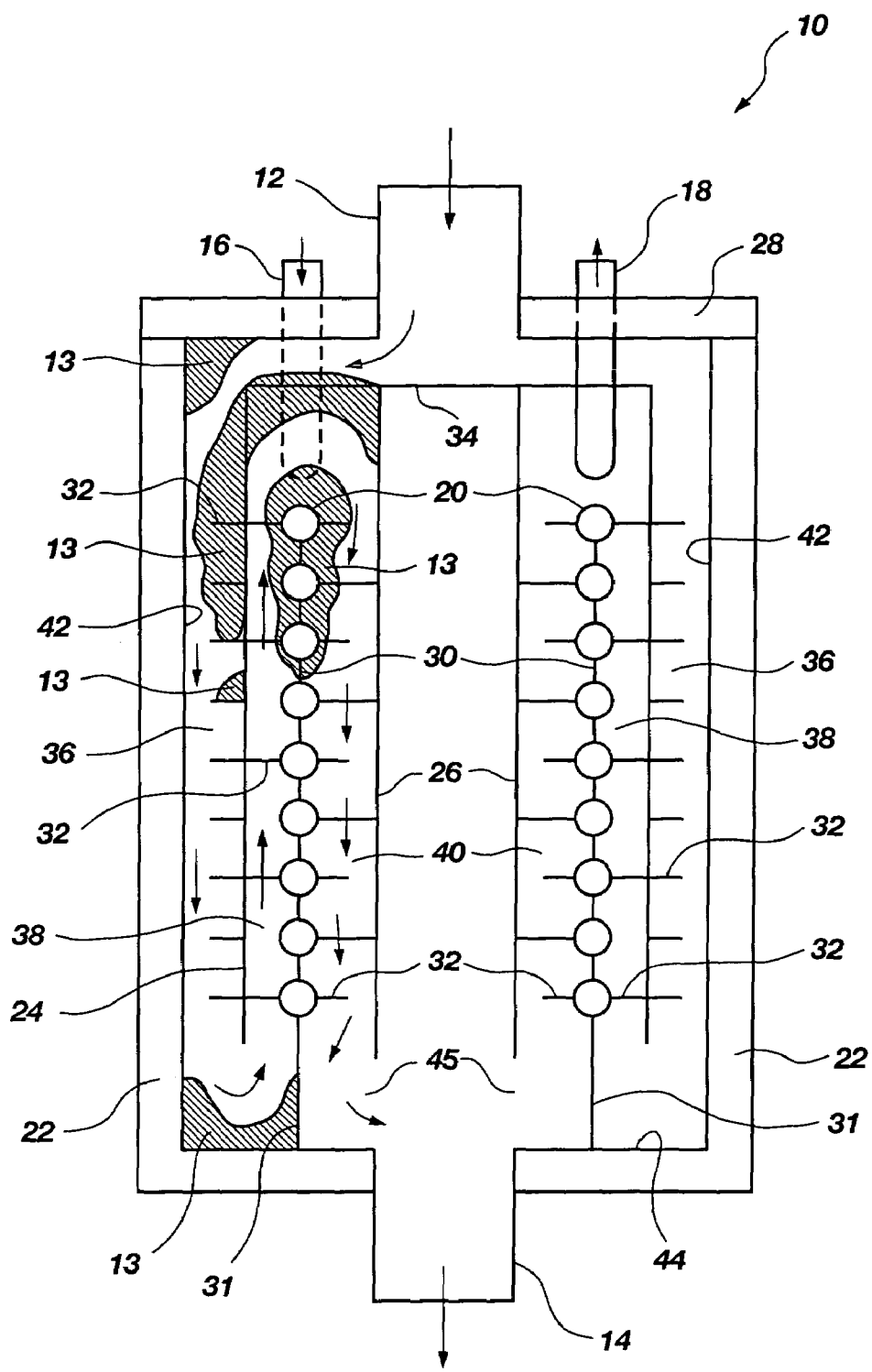
FIG. 1C is a partial side cross-sectional view of an assembled conventional trap device shown in FIG. 1A including deposits therein.

Accordingly, during operation, gases pass through the trap device 210 in a similar fashion as described with respect to the conventional trap device 10 as shown in FIGS. 1A–1C. Gases pass through the vacuum inlet 212 extending through top plate 228 and into the passages formed by inlet deflection plate 234, wall 242 of the cylindrical housing 222, outer deflection tube 224, coils 220, separation elements 230, sealing element 231, inner deflection tube 226, bottom inner surface 244 of the cylindrical housing 222, and baffles 232. Thus, the path of gases passing through trap device 210 may comprise vacuum inlet 212, annulus 236, annulus 238, annulus 240, aperture 245, and vacuum outlet 214. Cooling of the interior of the trap device 210 may be accomplished by a cooled medium passing through the cooling inlet 216, through the coils 220, and out of the cooling outlet 218.

As shown in FIG. 3A, thermal elements 278, 280, 282, 284, 286, 288, 290, 292, 294, and 296 may be disposed within the trap device 210 at different positions and in different configurations. Thermal elements 278, 280, 282, 284, 286, 288, 290, 292, 294, and/or 296 may be configured as heating elements. For instance, thermal element 282 may be a substantially planar heating element that is superimposed upon at least a portion of the surface of the outer deflection tube 224 and/or baffles 232. Alternatively, heating elements may comprise tubular heating elements that extend along the surfaces intended to be heated at different positions and having different lengths. Many configurations are known in the art for heating elements, and the present invention is not limited to any particular configuration. Accordingly, the present invention is not limited to any one type of heat generation technology and may comprise resistive heating elements, inductive heating elements, microwave heating devices, thermoelectric devices, or lasers, or other energy generation/delivery configurations may be used as known in the art.

Alternatively or additionally, thermal elements 278, 280, 282, 284, 286, 288, 290, 292, 294, and 296 may be configured to cool the interior of the trap device 210. For instance, thermal element 282 may be a substantially planar cooling element that is superimposed upon at least a portion of the surface of the outer deflection tube 224 and/or baffles 232. Alternatively, cooling elements may comprise tubular cooling elements or coiled cooling elements that extend along the surfaces intended to be cooled at different positions and having different lengths. Many configurations are known in the art for cooling elements, and the present invention is not limited to any particular configuration. Moreover, the present invention is not limited to any one type of cooling technology.

Thus, as may be seen, the thermal characteristics of the trap device that is under vacuum, at a pressure below atmospheric pressure, may be controlled so that deposit formation and distribution is influenced. Accordingly, influencing deposit formation and distribution may provide a mechanism for extending the time between required cleanings. For instance, the trap device may be configured to operate in one or more modes of operation so as to be filled with deposits of constituents removed from the gas stream passing therethrough in a substantially uniform manner to maximize the utility of the internal volume of the trap device to accumulate deposits before the trap device is cleaned. Further, such thermal characteristic control may also improve the efficiency of the trap device.

Illustratively, thermal elements 278, 280, 282, 284, 286, 288, 290, 292, 294 and 296 may be selectively operated in response to deposits 213 forming within the trap device 210. FIG. 3B shows that deposits 213 may form at least on a portion of each of the surfaces of thermal elements 280 and 282. Accordingly, thermal elements 280 and 282 may be configured to generate heat and thereby operate in response to measurement or any other indication that deposits may be accumulating thereon. Thus, deposits 213 may be at least partially removed from the surfaces of thermal elements 280 and 282. It may be desirable that any deposits 213 that are vaporized and/or melted may occupy another region of the trap device 210, so thermal elements 294 and 296 may be configured as cooling elements. Operation of thermal elements 294 and 296 in a cooling mode may cause deposits to form thereon. Thus, the present invention may employ a number of thermal elements, at least one configured as a heating element and at least one configured as a cooling element wherein the selective use of heating and cooling may be determined by deposits as they form within the trap device 210. Furthermore, other aspects of the present invention may be used in combination with thermal elements, such as delivery of a substance within the trap device.

Therefore, thermal elements may be used to influence the formation and distribution of deposits within the trap device. Stated another way, the heating elements may be used to influence the temperature distribution within the trap device and thereby influence the magnitude and location for formation of deposits therein. For instance, initially, thermal elements 278, 280, 282, 284, 286, 288, 290, 292, 294 and 296 within the trap device 210 may be operated to heat the surfaces thereof to reduce or remove deposits and thermal elements 294 and 296 may be operated so that heat is removed from the surfaces thereof so that deposits may form within annulus 240 of the trap device 210. Measurement devices 272, 274, and 276 may be used to measure a characteristic of a deposit within the trap device 210. Upon a measurement indicating that deposits 213 within annulus 240 are sufficiently reduced or removed, thermal elements 278 and 280 may be controlled to cease to generate any additional heat, thus allowing deposits 213 to form proximate thereto. Alternatively or additionally, thermal elements 278 and 280, if configured to both generate heat and remove heat from the trap device 210, may be caused to cool the surfaces thereof, thus encouraging deposits to form thereon. Similarly, upon an indication that deposits 213 proximate to heating elements 278 and 280 are of a desired or sufficient volume, thermal elements 284 and 288 may cease to generate heat or may be cooled, thus allowing deposits 213 to form proximate thereto. Upon a measurement indicating that deposits 213 proximate to heating elements 284 and 288 are of a desired or sufficient volume, heating elements 282 and 286 may cease to generate heat or may be cooled, thus allowing deposits to form proximate thereto. Finally, upon a measurement indicating that deposits 213 proximate to thermal elements 282 and 286 are of a desired or sufficient volume, a signal may be caused indicating that the trap device 210 may require cleaning.

Measurements of the deposits may comprise a characteristic of the deposit, such as thickness or weight, or may be empirically derived predictions of the deposits according to a passage of time, according to the volume of gases used in a particular process, or by other process parameters or modeling. In addition, measurements may comprise measurements of an operating condition of the trap device, such as temperature, constituent concentration, flow rates, or other process or operating conditions. Furthermore, strategies for distributing the deposits within a trap device may be developed empirically, by modeling, or otherwise. The present invention is not limited to any particular sequence or configuration in relation to heating and/or cooling via thermal elements used in conjunction with a trap device.

Figure 3C:
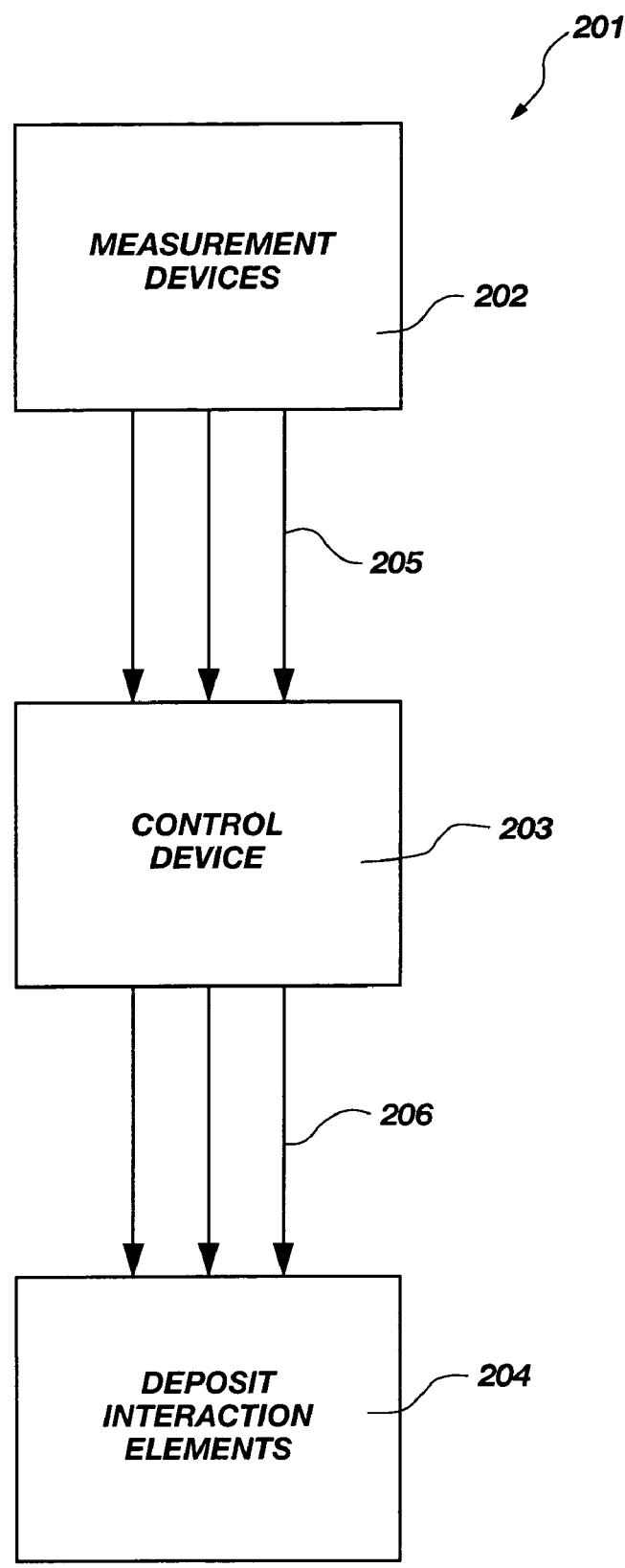
FIG. 3C is a block diagram illustrating measurement devices, a control device, and deposit interaction elements in accordance with the present invention.

In a further aspect of the present invention, thermocouples may be utilized to supply signals to a control device for altering the response of thermal elements 278, 280, 282, 284, 286, 288, 290, 292, 294, and 296 in relation thereto. Measurement devices 272, 274, and 276 may be configured for measuring a characteristic of a deposit 213 and may also be utilized to supply a signal to a control device for altering the response of deposit interaction elements in relation thereto. Moreover, a signal from a measurement device indicating an operational condition in relation to a trap device of the present invention may be utilized by a control device for altering the response of a deposit interaction element thereto. FIG. 3C shows a schematic diagram of a system 201 including a control device 203 for altering the response of one or more deposit interaction elements 204 in relation to signals 205 communicated thereto from one or more measurement devices 202. Furthermore, the deposit interaction elements 204 may be controlled by way of a control device 203 via associated control conduits 206, such as wires or pipes according to automatic control concepts and models, responsive to measurements from within the trap device, or a combination thereof.

Figure 4A:
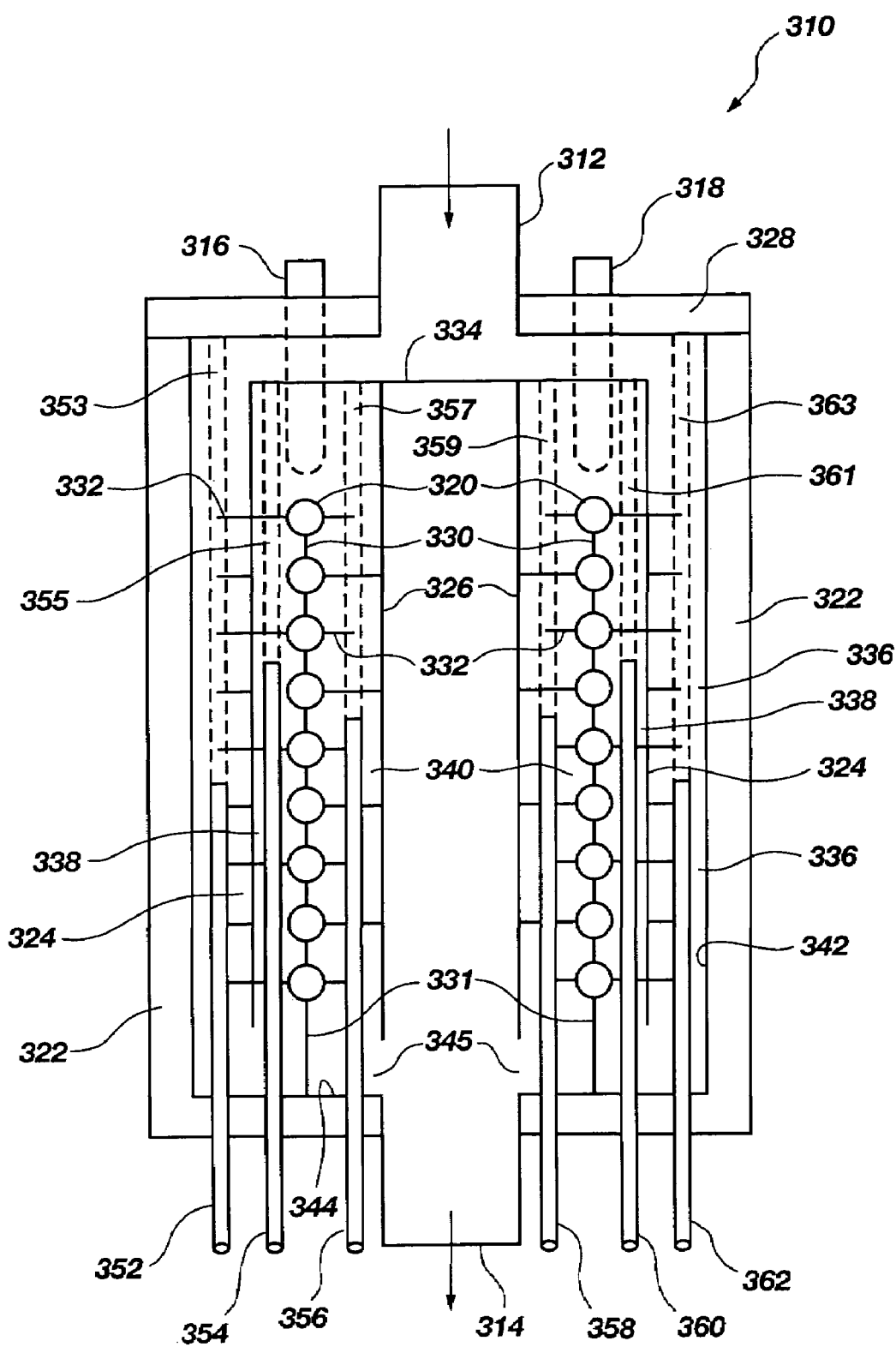
FIG. 4A is a side cross-sectional view of yet another embodiment of a trap device of the present invention including movable deposit interaction elements.

In yet another exemplary embodiment, turning to FIG. 4A, during operation, gases may pass through the trap device 310 in a similar fashion as described with respect to the conventional trap device 10 as shown in FIGS. 1A–1C. Gases may pass through the vacuum inlet 312 extending through top plate 328 and into the passages formed by inlet deflection plate 334, wall 342 of the cylindrical housing 322, outer deflection tube 324, coils 320, separation elements 330, sealing element 331, inner deflection tube 326, bottom inner surface 344 of the cylindrical housing 322, and baffles 332. Thus, the path of gases passing through trap device 310 may comprise vacuum inlet 312, annulus 336, annulus 338, annulus 340, aperture 345, and vacuum outlet 314. Cooling of the interior of the trap device 310 may be accomplished by a cooled medium passing through the cooling inlet 316 through the coils 320, and out of the cooling outlet 318.

Movable elements 352, 354, 356, 358, 360, and 362 may be employed to distribute deposits within the trap device 310. As shown in FIG. 4A, movable elements 352 and 362 may be configured to be movable along their length within annulus 336, as shown and depicted by paths 353 and 363, respectively. Also, movable elements 354 and 360 may be configured to be movable along their length within annulus 338 as well as the paths depicted by 355 and 361, respectively. Similarly, movable elements 356 and 358 may be configured to be movable along their length within annulus 340 as well as along the paths 357 and 359, respectively. Thus, movable elements 352, 354, 356, 358, 360, and 362 may be configured to physically interact with deposits that form within the trap device 310. Put another way, movable elements 352, 354, 356, 358, 360, and 362 may push, pull, cut, scrape, shear, deform, or otherwise apply a force to deposits that form within trap device 310 to distribute or redistribute deposits 313 therein. In doing so, it may be apparent that deposits within a particular region of the trap device 310 may be reduced or thinned, while deposits within another region of the trap device 310 may be increased or thickened. Deposits that are sheared, cut, or otherwise within the trap device 310 may simply be disposed as gravity and the orientation of the trap device 310 determine.

Figure 4B:
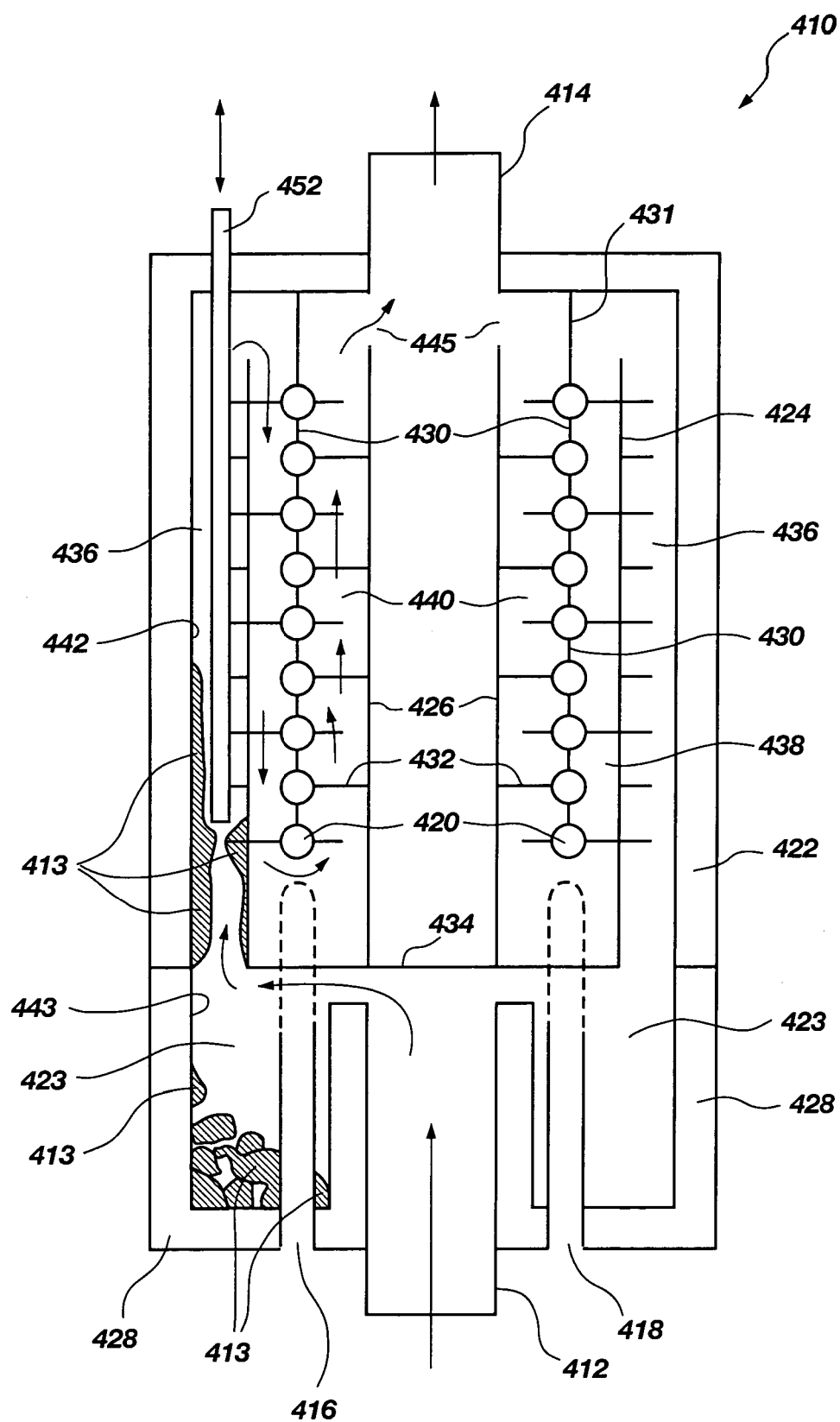
FIG. 4B is a side cross-sectional view of still another embodiment of a trap device of the present invention including movable deposit interaction elements and a deposit storage region within the trap device during operation.
Figure 4C:
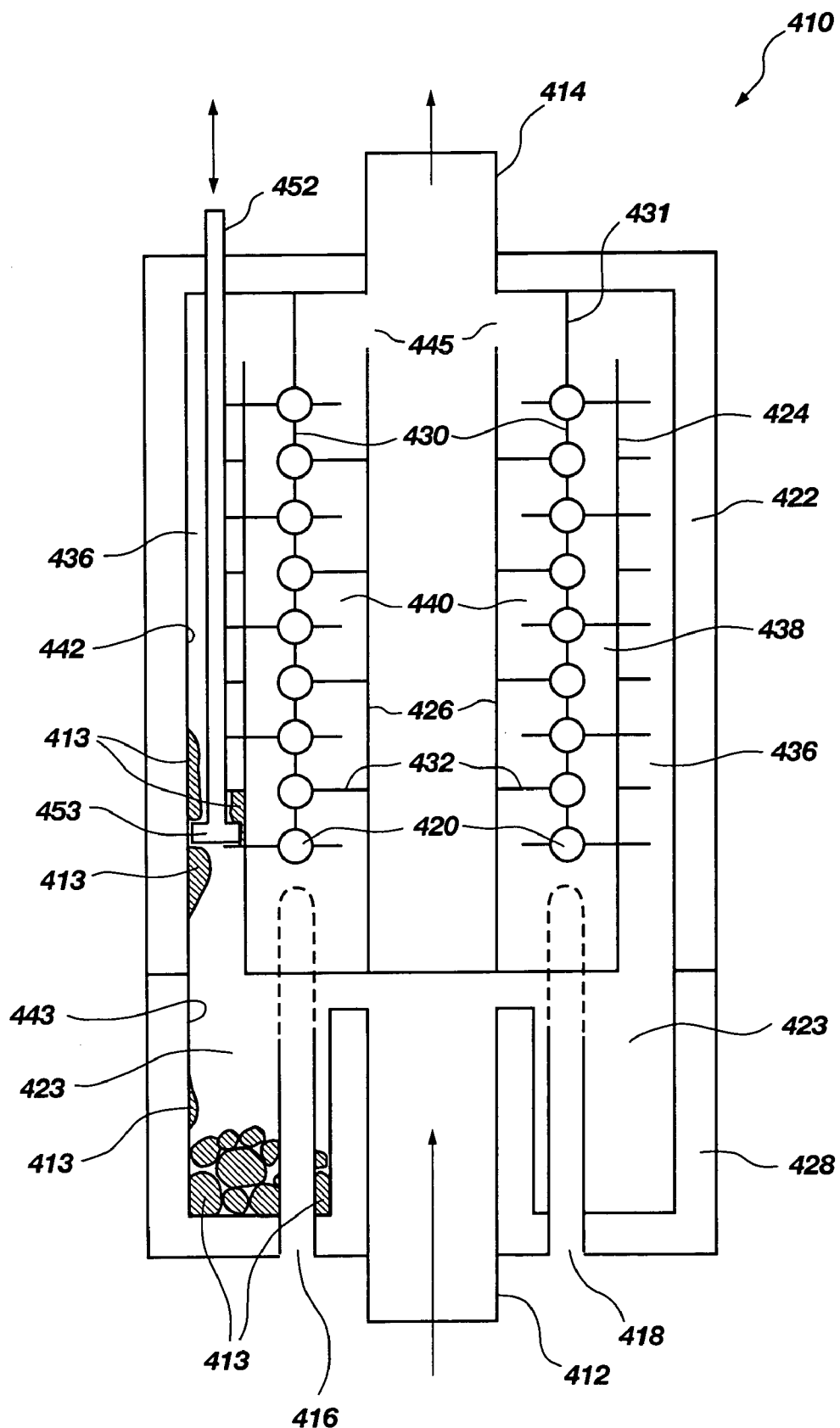
FIG. 4C is a side cross-sectional view of the embodiment of a trap device shown in FIG. 4B including movable deposit interaction elements and a deposit storage region within the trap device during operation.

FIGS. 4B–4C show a further exemplary embodiment that employs movable elements. During operation, gases may pass through the trap device 410 through the vacuum inlet 412 and into the passages formed by inlet deflection plate 434, wall 442 of the cylindrical housing 422, wall 443 of the end cap 428, outer deflection tube 424, coils 420, separation elements 430, sealing element 431, inner deflection tube 426, and baffles 432. Thus, the path of gases passing through trap device 410 may comprise vacuum inlet 412, annulus 436, annulus 438, annulus 440, aperture 445, and vacuum outlet 414. Cooling of the interior of the trap device 410 may be accomplished by a cooled medium passing through the cooling inlet 416, through the coils 420, and out of the cooling outlet 418. A sealing element (not shown) may provide a vacuum seal between the mating surfaces of the end cap 428 and the cylindrical housing 422.

FIGS. 4B and 4C each show a trap device 410 wherein the cylindrical housing 422 and end cap 428 form a storage region 423 for collecting deposits 413 that have been distributed from annulus 436. Of course, deposits 413 may also form within storage region 423, as shown. Thus, the trap device 410 may be oriented so that deposits 413 that are distributed from annulus 436 are influenced by gravity to fall into storage region 423. Such a configuration may extend the amount of time of use before cleaning is required. Thus, as the annulus 436 at least partially fills with deposits 413, the movable element 452 may be moved within the annulus 436 so as to distribute or redistribute a portion of the deposits 413, causing some of the deposits 413 to fall into the storage region 423. FIG. 4C shows a movable element 452 that includes an expandable head 453 for removing deposits within annulus 436. Expandable head 453 may be contracted so that the outer diameter of the movable element 452 does not interfere with the outer diameter of the baffles 432 as the movable element 452 may be moved axially along annulus 436. However, upon expandable head 453 being disposed between two baffles, the expandable head 453 may be expanded so as to contact and distribute deposits 413 within annulus 436 by way of rotation. Expandable head 453 may include fluted, sharpened geometries for distribution of deposits 413 within annulus 436. Rotation of expandable head 453 may be only partial rotation of less than 360°, so that deposits are essentially scraped from the surface of annulus 436. Alternatively, full rotation of expandable head 453 may be employed so that the deposits 413 are drilled or milled within annulus 436 and distributed within storage region 423. Thus, a movable element of the present invention may include a machining tool, such as a drill bit, a milling bit, a grinding implement, or a sharpened edge.

The present invention contemplates that any of the above-described embodiments may be used in combination. For example, movable elements may be used in combination with heat and/or substance delivery elements to distribute deposits within a trap device. Thus, it may be advantageous to employ aspects of one or more embodiments of the present invention in combination with other aspects of one or more embodiments of the present invention.

One of the reasons that the trap device must be cleaned is that when deposits form in a specific area, the available cross-sectional conduit area for transmission of gases is reduced, and if deposits continue to form within the area, the conduit area may be entirely closed off, thus preventing the flow of gases through the trap device and preventing the vacuum pump or other vacuum generating device from maintaining the desired level of vacuum gage pressure. Therefore, another aspect of the present invention includes inhibiting the formation of deposits along a substantially continuous path through the trap device. Put another way, a substantially continuous path through a trap device may be maintained. In this way, deposits may form with the trap device in areas not defined by the substantially continuous path until those areas are substantially filled. Then the trap device may be cleaned.

Figure 5A:
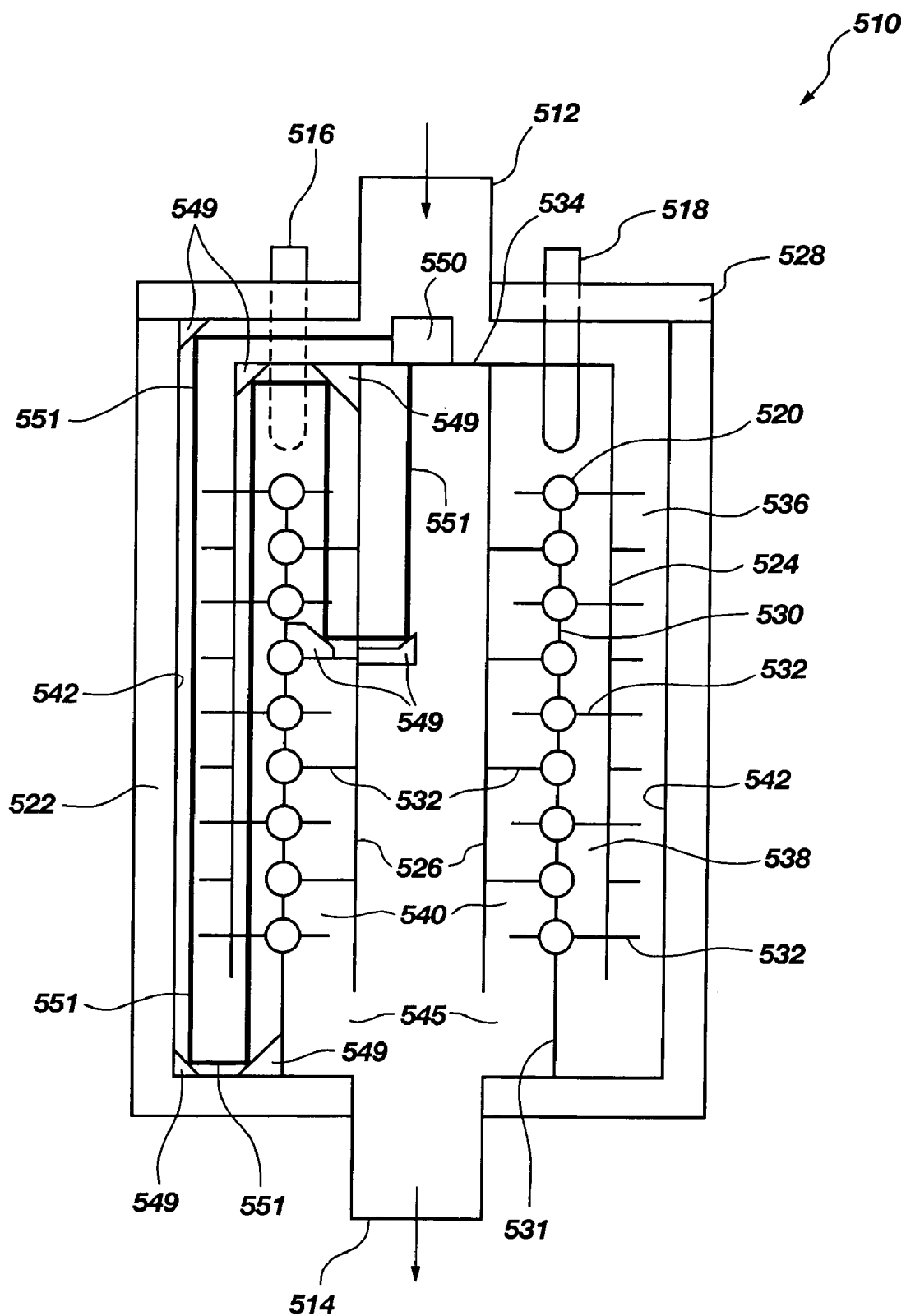
FIG. 5A is a side cross-sectional view of an embodiment of a trap device according to the present invention including a laser disposed along a substantially continuous path within the trap device.
Figure 5B:
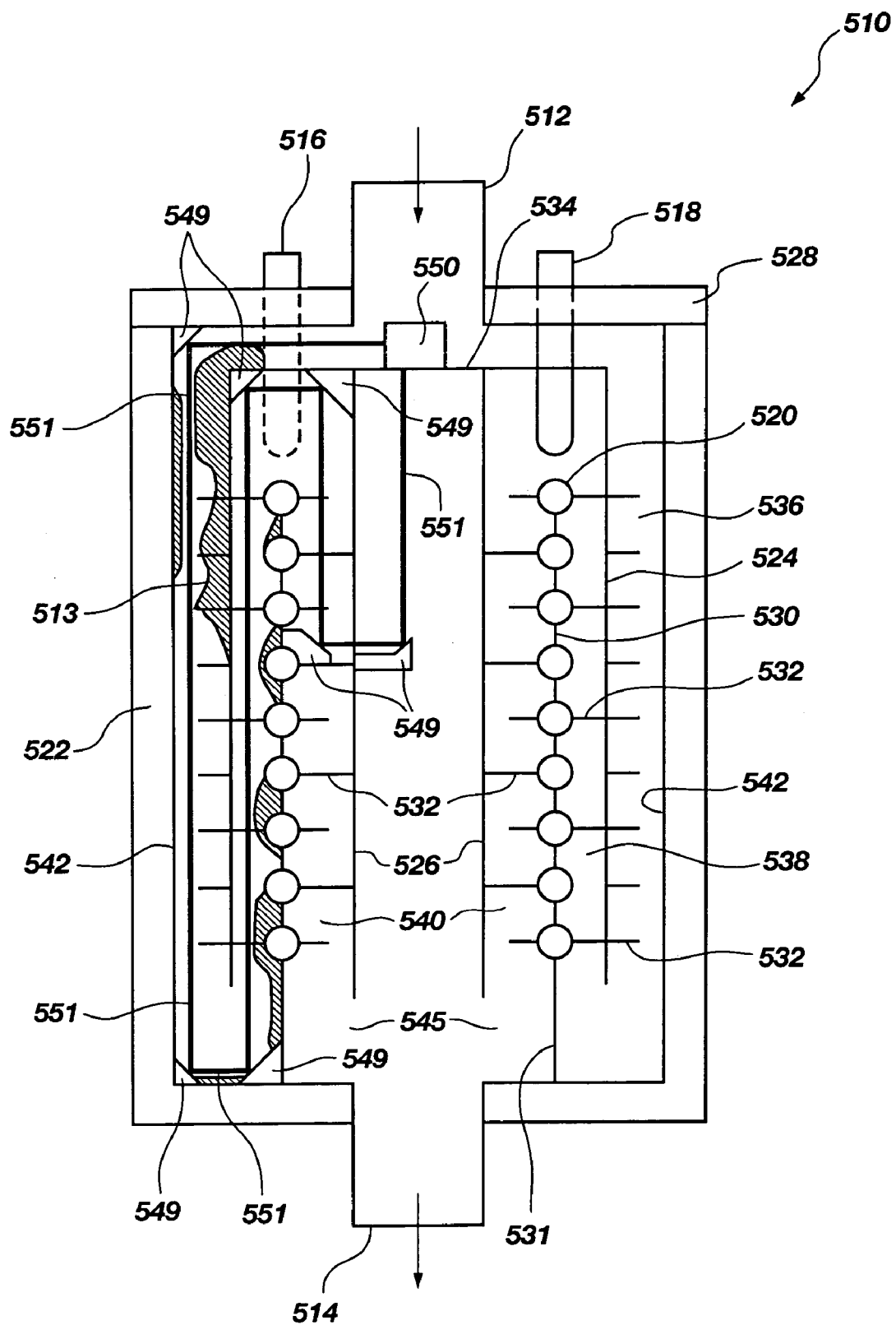
FIG. 5B is a side cross-sectional view of the embodiment of a trap device of the present invention as shown in FIG. 5A during operation.

Accordingly, in a further embodiment of the present invention, shown in FIGS. 5A and 5B, a laser beam may be used to prevent the formation of deposits along a substantially continuous path 551 within the trap device 510. For instance, as shown in FIGS. 5A and 5B, a laser beam-generating device 550 may be used to prevent the formation of deposits along a path 551 that the laser beam emitted therefrom travels. Put another way, a laser beam-generating device 550 may be used to generate a laser beam to prevent formation of deposits along the path defined thereby, or to ablate such deposits to remove them. Mirrors 549 may be used to reflect a beam of laser light emitted from laser generating device 550, thereby defining path 551. Further, although laser generating device 550 is shown as producing a laser beam that travels along one path 551, the present invention contemplates that multiple paths may be traveled by one or more laser beams. For instance, mirrors 549, as shown in FIGS. 5A and 5B, may be annular, and the laser generating device 550 may be configured to deliver laser light beams to more than one position about the circumference of the trap device 510. Alternatively, the laser beam-generating device 550 may be configured to rotate so that the laser light beams emitted therefrom may be directed accordingly to reflect from the annular mirrors 549 about the entire circumference of trap device 510. Of course, beam splitters, lenses, or other optics may be used as known in the art to facilitate alignment and focusing of laser beams as desired or required. In a noncircular trap device, the laser generating device may be configured to deliver a beam of laser light to more than one position along the periphery thereof.

As shown in FIG. 5A, during operation, gases may pass into the trap device 510 through the vacuum inlet 512 extending through top plate 528 and into the passages formed by inlet deflection plate 534, wall 542 of the cylindrical housing 522, outer deflection tube 524, coils 520, separation elements 530, sealing element 531, inner deflection tube 526, and baffles 532. Thus, the path of gases passing through trap device 510 may comprise vacuum inlet 512, annulus 536, annulus 538, annulus 540, aperture 545, and vacuum outlet 514. Cooling of the trap device 510 may be accomplished by a cooled medium passing through the cooling inlet 516, through the coils 520, and out of the cooling outlet 518.

As shown in FIG. 5B, deposits 513 may form on the inlet deflection plate 534, wall 542 of the cylindrical housing 522, outer deflection tube 524, coils 520, separation elements 530, sealing element 531, inner deflection tube 526, and baffles 532. However, the path 551 may be substantially free from deposits 513.

Of course, in addition, a substantially continuous path within a trap device may be created, preserved, and/or maintained mechanically, chemically, thermally, or otherwise. As mentioned hereinabove, combinations of the various above-described embodiments may be employed to distribute deposits within a trap device of the present invention. For instance, movable elements may be used to deliver heat within a trap device or movable elements may be used to deliver a chemical within the trap device. Additionally, movable elements may be used to concentrate deposits within a region of the trap device, and then thermal elements may be employed to further distribute deposits within the trap device.

In one exemplary implementation of the present invention, a trap device may be configured with about a 22 inch height or length and a 6 inch to 8 inch diameter to provide a gas path length of about 45 inches therethrough and accommodate a gas flow rate therethrough of about 20 liters per minute. One example may be water-cooled trap devices of the types commercially available from Nor-Cal Products, Inc. of Yreka, California. The trap device of the present invention may be suitable for use with a process chamber operated at a pressure of about 100 torr or less, and with a mercury-type vacuum pump capable of drawing a vacuum to a level of about 5 to 10 torr. The process chamber may comprise, for example, a CVD process chamber, a plasma-enhanced CVD (PECVD) chamber, a metallic-organic CVD process chamber, or any other CVD process chamber as known in the art. Further, the present invention may be suitable for use with any CVD chamber operated conventionally or as an ALD chamber.

While the trap device of the present invention, alone and in combination with different embodiments thereof, has been disclosed herein in terms of certain exemplary embodiments, these are exemplary only and the invention is not so limited. It will be appreciated by those of ordinary skill in the art that many additions, deletions and modifications to the invention may be made without departing from the scope of the claims.

What is claimed is:

1. A trap device for removing at least one undesirable constituent from a gaseous process stream passing through a vacuum system comprising:
    a chamber configured to operate at a pressure below atmospheric pressure; and
    a plurality of substance delivery elements comprising:
        a first substance delivery element configured to deliver a first substance; and
        a second substance delivery element configured to deliver a second, different substance to an interior of the chamber.

2. The trap device of claim 1, wherein the substance delivery element is configured to prevent formation of deposits comprising the at least one undesirable constituent thereon.

3. The trap device of claim 2, wherein the first substance delivery element is configured for modification of a temperature of at least a portion thereof.

4. The trap device of claim 1, wherein the first substance delivery element is configured to remove or clean deposits comprising the at least one undesirable constituent therefrom.

5. The trap device of claim 4, wherein the first substance delivery element is configured for modification of a temperature of at least a portion thereof.

6. The trap device of claim 1, wherein the first substance comprises water or ammonia.

7. The trap device of claim 1, wherein the first substance delivery element is configured to deliver the first substance to cause formation of a deposit comprising the at least one undesirable constituent within the interior of the chamber.

8. The trap device of claim 1, wherein the first substance delivery element is configured to deliver the first substance to cause formation of at least one precipitate comprising the at least one undesirable constituent within the interior of the chamber.

9. The trap device of claim 8, wherein the first substance is formulated to cause the formation of at least one precipitate comprising at least one of titanium, titanium dioxide, hydrochloric acid, water, and ammonia chloride.

10. The trap device of claim 1, wherein the first substance delivery element is configured to thermally facilitate formation of a deposit comprising the at least one undesirable constituent within the interior of the chamber.

11. The trap device of claim 10, wherein the first substance delivery element is configured to thermally facilitate formation of a deposit comprising the at least one undesirable constituent within the trap device by removing heat from a gas within the interior of the chamber.

12. The trap device of claim 8, wherein the first substance delivery element is configured to prevent formation thereon or facilitate removal therefrom of deposits comprising the at least one undesirable constituent thereon.

13. The trap device of claim 12, wherein the first substance delivery element is configured for modification of a temperature of at least a portion thereof.

14. The trap device of claim 1, wherein the first substance delivery element is configured for modification of a temperature of at least a portion thereof.

15. The trap device of claim 12, wherein the first substance delivery element is configured to facilitate cleaning thereof.

16. The trap device of claim 1, wherein the first substance delivery element includes at least one nozzle or atomizer for delivery of the first substance.

17. The trap device of claim 1, further comprising a control device for controlling a rate at which the first substance is delivered by the first substance delivery element.

18. The trap device of claim 17, wherein the control device comprises at least one valve.

19. The trap device of claim 1, further comprising at least one measurement device for measuring an amount of a deposit comprising the at least one undesirable constituent within the interior of the chamber.

20. The trap device claim 1, wherein each substance delivery element of the plurality is arranged to deliver at least one substance to a different location within the interior of the chamber.

21. The trap device of claim 1, wherein the first substance delivery element is configured to deliver more than one substance to the interior of the chamber.

22. The trap device of claim 1, further comprising at least one measurement device for measuring at least one characteristic of a deposit comprising the at least one undesirable constituent within the interior of the chamber.

23. The trap device of claim 22, wherein the first substance delivery element is configured to deliver the first substance within the chamber of the trap device according to a first range of the at least one characteristic of the deposit measured by the at least one measurement device and another, different substance according to a second range of the at least one characteristic of the deposit measured by the at least one measurement device.

24. The trap device of claim 1, wherein the first substance delivery element is configured to at least partially preserve a substantially continuous path through deposits comprising the at least one undesirable constituent through the interior of the chamber.

25. The trap device of claim 1, wherein the first substance delivery element is configured for inhibiting formation of deposits comprising the at least one undesirable constituent along a substantially continuous path through the interior of the chamber.

26. A trap device for removing at least one undesirable constituent from a gaseous process stream passing through a vacuum system comprising:
    a chamber configured to operate at a pressure below atmospheric pressure;
    at least one deposit interaction element for distributing or redistributing deposits comprising the
        at least one undesirable constituent formed within the chamber of the trap device;
    a measurement device configured to measure and communicate a signal indicating at least one of a temperature within the chamber and at least one characteristic of a deposit within the chamber; and
    a control device in communication with the measurement device signal configured to alter delivery of at least one substance in response thereto.

27. The trap device of claim 26, wherein the at least one deposit interaction element is configured to cause at least a portion of the deposits to form a liquid or gas state within the chamber of the trap device.

28. The trap device of claim 26, wherein the at least one deposit interaction element is configured to cause at least a portion of the deposits to form a gaseous state within the chamber of the trap device.

29. The trap device of claim 26, wherein the at least one deposit interaction element is configured to facilitate formation of a deposit in at least one region of the chamber.

30. The trap device of claim 26, wherein the at least one deposit interaction element is configured to at least partially remove a deposit from at least a portion of the chamber.

31. The trap device of claim 26, wherein the at least one deposit interaction element is configured to at least partially preserve a substantially continuous path through the chamber of the trap device.

32. The trap device of claim 26, wherein the at least one deposit interaction element is configured for inhibiting formation of or removing deposits from along a substantially continuous path through the chamber of the trap device.

33. The trap device of claim 32, wherein the at least one deposit interaction element comprises a laser beam-generating device for generating a laser beam positioned and sized for inhibiting formation of deposits or removing deposits from along the substantially continuous path through the chamber of the trap device.

34. The trap device of claim 33, further comprising at least one of a mirror, a lens, and a beam splitter for communicating the laser beam along the substantially continuous path through the chamber of the trap device.

35. The trap device of claim 26, wherein the at least one deposit interaction element comprises at least one thermal element for modifying a temperature of at least a portion of the chamber to influence formation of deposits therewithin.

36. The trap device of claim 35, wherein the at least one thermal element comprises at least one of a heat-generating element, a cooling element and a heat transfer element.

37. The trap device of claim 35, wherein the at least one thermal element comprises a thermoelectric device.

38. The trap device of claim 35, further comprising a measurement device configured to measure and communicate a signal indicating at least one of a temperature of the at least one thermal element and a characteristic of a deposit within the chamber.

39. The trap device of claim 38, further comprising a control device in communication with the measurement device signal configured to alter a response of the at least one thermal element in relation thereto.

40. The trap device of claim 39, wherein the at least one thermal element comprises a plurality of thermal elements.

41. The trap device of claim 40, wherein each of the plurality of thermal elements is configured to modify a temperature of an adjacent portion of the chamber independently of at least one other thermal element of the plurality.

42. The trap device of claim 26, wherein the at least one deposit interaction element comprises at least one delivery port for delivering at least one substance within the chamber.

43. The trap device of claim 42, wherein the at least one delivery port is configured for modification of a temperature thereof.

44. The trap device of claim 42, wherein the at least one delivery port is configured to facilitate removal of deposits therefrom.

45. The trap device of claim 42, wherein the at least one delivery port is configured to deliver at least one substance comprising water or ammonia.

46. The trap device of claim 42, wherein the at least one delivery port is configured to cause formation of the deposit within the chamber.

47. The trap device of claim 42, wherein the at least one delivery port is configured to deliver at least one substance to cause formation of at least one precipitate within the chamber.

48. The trap device of claim 47, wherein the at least one precipitate includes at least one of titanium, titanium dioxide, hydrochloric acid, water and ammonium chloride.

49. The trap device of claim 42, wherein the at least one delivery port is configured to thermally facilitate formation of the deposit within the chamber.

50. The trap device of claim 42, wherein the at least one delivery port includes at least one nozzle or atomizer.

51. The trap device of claim 42, wherein the control device is configured for controlling a rate at which the at least one substance is delivered via the at least one delivery port.

52. The trap device of claim 51, wherein the control device comprises at least one valve.

53. The trap device of claim 26, wherein the at least one characteristic of the deposit is a thickness of the deposit.

54. The trap device of claim 42, wherein the at least one delivery port is configured to deliver more than one substance within the chamber.

55. The trap device of claim 42, wherein the at least one delivery port is configured to at least partially preserve a substantially continuous path through the deposits within the chamber.

56. The trap device of claim 42, wherein the at least one delivery port is configured for inhibiting formation of deposits or removing deposits from along a substantially continuous path through the chamber.

57. The trap device of claim 26, wherein the at least one deposit interaction element is configured to physically interact with a deposit within the trap device.

58. The trap device of claim 57, wherein the at least one deposit interaction element is configured to at least partially remove a deposit from a region within the trap device.

59. The trap device of claim 57, wherein the at least one deposit interaction element is configured to substantially maintain a continuous path through the trap device.

60. The trap device of claim 57, wherein the at least one deposit interaction element is configured to translate, rotate, or articulate.

61. The trap device of claim 57, wherein the at least one deposit interaction element includes an expandable element.

62. The trap device of claim 57, wherein the at least one deposit interaction element includes a machining tool comprising one of a drill bit, a milling bit, and a grinding implement.

63. The trap device of claim 57, wherein the at least one deposit interaction element includes a sharpened edge.

64. The trap device of claim 57, further comprising a measurement device configured to measure and communicate a signal indicating a characteristic of a deposit within the chamber.

65. The trap device of claim 64, further comprising a control device in communication with the measurement device signal configured to alter a physical interaction between the at least one deposit interaction element and the deposit in relation thereto in response to the measurement device signal.

66. The trap device of claim 65, wherein the at least one deposit interaction element is configured to physically contact a deposit exceeding a selected boundary within the trap device.

67. The trap device of claim 57, wherein the at least one deposit interaction element is configured to remove deposits from one region of the chamber and reposition the removed deposits within a selected storage region of the chamber.

68. A vacuum system, comprising:
a vacuum source;
a trap device for removing at least one undesirable constituent from a gaseous process stream passing through the vacuum system, the trap device having a chamber configured to operate at a pressure below atmospheric pressure; wherein the trap device includes at least one deposit interaction element for distributing or redistributing deposits comprising the at least one undesirable constituent within the chamber of the trap device and a measurement device configured to measure and communicate a signal indicating at least one of a temperature within the chamber and the thickness of a deposit within the chamber.

69. The vacuum system of claim 68, wherein the at least one deposit interaction element is configured to cause at least a portion of the deposits to form a liquid or gas state within the chamber of the trap device.

70. The vacuum system of claim 68, wherein the at least one deposit interaction element is configured to cause at least a portion of the deposits to form a gaseous state within the chamber of the trap device.

71. The vacuum system of claim 68, wherein the at least one deposit interaction element is configured to facilitate formation of the deposit in at least one region of the chamber.

72. The vacuum system of claim 68, wherein the at least one deposit interaction element is configured to at least partially remove the deposit from at least a portion of the chamber.

73. The vacuum system of claim 68, wherein the at least one deposit interaction element is configured to at least partially preserve a substantially continuous path through the chamber.

74. The vacuum system of claim 68, wherein the at least one deposit interaction element is configured for inhibiting formation of deposits or removing deposits from along a substantially continuous path through the trap device.

75. The vacuum system of claim 74, wherein the at least one deposit interaction element comprises a laser beam-generating device for generating a laser beam positioned and sized for inhibiting formation of deposits or removing deposits from along the substantially continuous path through the trap device.

76. The vacuum system of claim 75, further comprising at least one of a mirror, a lens, and a beam splitter for communicating the laser beam along the substantially continuous path through the trap device.

77. The vacuum system of claim 68, wherein the at least one deposit interaction element comprises at least one thermal element for modifying a temperature of at least a portion of the chamber to influence formation of deposits therewithin.

78. The vacuum system of claim 77, wherein the at least one thermal element comprises at least one of a heat-generating element, a cooling element and a heat transfer element.

79. The vacuum system of claim 77, wherein the at least one thermal element comprises a thermoelectric device.

80. The vacuum system of claim 77, further comprising a measurement device configured to measure and communicate a signal indicating at least one of a temperature of the at least one thermal element and a characteristic of a deposit within the chamber.

81. The vacuum system of claim 80, further comprising a control device in communication with the measurement device signal configured to alter a response of the at least one thermal element in response thereto.

82. The vacuum system of claim 81, wherein the at least one thermal element comprises a plurality of thermal elements.

83. The vacuum system of claim 82, wherein each of the plurality of thermal elements is configured to modify a temperature of an adjacent portion of the chamber independently of at least one other thermal element of the plurality.

84. The vacuum system of claim 68, wherein the at least one deposit interaction element comprises at least one delivery port for delivering at least one substance within the chamber.

85. The vacuum system of claim 84, wherein the at least one delivery port is configured for modification of a temperature thereof.

86. The vacuum system of claim 84, wherein the at least one delivery port is configured to facilitate removal of deposits therefrom.

87. The vacuum system of claim 84, wherein the at least one delivery port is configured to deliver at least one substance comprising water or ammonia.

88. The vacuum system of claim 84, wherein the at least one delivery port is configured to cause formation of the deposit within the chamber.

89. The vacuum system of claim 84, wherein the at least one delivery port is configured to deliver at least one substance to cause formation of at least one precipitate within the chamber.

90. The vacuum system of claim 89, wherein the at least one precipitate includes at least one of titanium, titanium dioxide, hydrochloric acid, water and ammonium chloride.

91. The vacuum system of claim 84, wherein the at least one delivery port is configured to thermally facilitate formation of a deposit within the chamber.

92. The vacuum system of claim 84, wherein the at least one delivery port includes at least one nozzle or atomizer.

93. The vacuum system of claim 84, further comprising a control device for controlling the rate at which the at least one substance is delivered via the at least one delivery port.

94. The vacuum system of claim 93, wherein the control device comprises at least one valve.

95. The vacuum system of claim 68, further comprising a control device in communication with the measurement device signal configured to alter the delivery of the at least one substance in response thereto.

96. The vacuum system of claim 84, wherein the at least one delivery port is configured to deliver more than one substance within the chamber.

97. The vacuum system of claim 84, wherein the at least one delivery port is configured to at least partially preserve a substantially continuous path through the deposits within the chamber.

98. The vacuum system of claim 84, wherein the at least one delivery port is configured for inhibiting formation of deposits or removing deposits from along a substantially continuous path through the chamber.

99. The vacuum system of claim 68, wherein the at least one deposit interaction element is configured to physically interact with a deposit within the trap device.

100. The vacuum system of claim 99, wherein the at least one deposit interaction element is configured to at least partially remove a deposit from a region within the trap device.

101. The vacuum system of claim 99, wherein the at least one deposit interaction element is configured to substantially maintain a continuous path through the trap device.

102. The vacuum system of claim 99, wherein the at least one deposit interaction element is configured to translate, rotate, or articulate.

103. The vacuum system of claim 99, wherein the at least one deposit interaction element is includes an expandable element.

104. The vacuum system of claim 99, wherein the at least one deposit interaction element includes a machining tool comprising one of a drill bit, a milling bit, and a grinding implement.

105. The vacuum system of claim 99, wherein the at least one deposit interaction element includes a sharpened edge.

106. The vacuum system of claim 99, further comprising a measurement device configured to measure and communicate a signal indicating a characteristic of a deposit within the chamber.

107. The vacuum system of claim 106, further comprising a control device in communication with the measurement device signal configured to alter a response of the at least one deposit interaction element in response thereto.

108. The vacuum system of claim 107, wherein the at least one deposit interaction element is configured to physically contact a deposit exceeding a selected boundary within the trap device.

109. The vacuum system of claim 99, wherein the at least one deposit interaction element is configured to remove deposits from one region of the chamber and reposition the removed deposits within a selected storage region of the chamber.

110. A method for forming deposits within a trap device having a chamber configured to remove at least one undesirable constituent from a gaseous process stream passing through a vacuum system comprising:
  causing a pressure below atmospheric pressure within a chamber of the trap device;
  measuring at least one of an operating condition of the trap device and a characteristic of a deposit within the chamber of the trap device; and
  influencing distribution or redistribution of deposits comprising the at least one undesirable constituent within the chamber of the trap device during operation thereof by introducing a substance within the chamber of the trap device and altering the introduction of the substance in response to the measurement.

111. The method of claim 110, wherein influencing the distribution of deposits within the trap device comprises promoting formation of the deposits within at least a region of the chamber.

112. The method of claim 110, wherein influencing the distribution or redistribution of deposits within the trap device comprises inhibiting formation of the deposits within at least a region of the chamber.

113. The method of claim 110, wherein introducing the substance within the chamber comprises causing a chemical reaction between the at least one undesirable constituent within the gaseous process stream and the substance.

114. The method of claim 110, further comprising forming a precipitate within the gaseous process stream within the chamber of the trap device.

115. The method of claim 114, wherein forming a precipitate comprises forming a precipitate comprising at least one of titanium, titanium dioxide, hydrochloric acid, water, and ammonia chloride.

116. The method of claim 110, further comprising controlling a rate of introduction of the substance within the chamber.

117. The method of claim 110, wherein altering the introduction of the substance in response to the measuring of at least one of an operating characteristic of the trap device and a characteristic of a deposit within the chamber comprises selecting at least one location to introduce the substance.

118. The method of claim 110, wherein altering the introduction of the substance in response to the measuring of at least one of an operating characteristic of the trap device and a characteristic of a deposit within the chamber comprises controlling rates at which the substance is introduced within the trap device at more than one location of introduction.

119. The method of claim 110, wherein influencing the distribution or redistribution of deposits within the chamber of the trap device comprises heating at least a region therein.

120. The method of claim 110, wherein influencing the distribution or redistribution of deposits within the chamber of the trap device comprises transferring heat therein.

121. The method of claim 110, wherein influencing the distribution or redistribution of deposits within the chamber of the trap device comprises removing heat therefrom.

122. The method of claim 110, wherein influencing the distribution or redistribution of deposits within the chamber of the trap device comprises altering a thermal environment in at least a portion thereof.

123. The method of claim 110, wherein influencing the distribution or redistribution of deposits within the trap device comprises altering a thermal environment within the chamber of the trap device in response to the measuring.

124. The method of claim 123, wherein altering the thermal environment within the chamber of the trap device in response to the measuring comprises selecting at least one region within the chamber to heat or cool.

125. The method of claim 124, wherein altering the thermal environment within the chamber of the trap device according to the measurement comprises heating or cooling different regions within the chamber of the trap device.

126. The method of claim 110, wherein influencing the distribution or redistribution of deposits within the chamber of the trap device comprises applying a force to a deposit therein.

127. The method of claim 110, wherein influencing the distribution or redistribution of deposits within the chamber of the trap device comprises physically manipulating a deposit therein.

128. The method of claim 110, wherein influencing the distribution or redistribution of deposits within the trap device comprises moving a deposit therein.

129. The method of claim 110, wherein influencing the distribution or redistribution of deposits within the trap device comprises machining a deposit therein.

130. The method of claim 110, wherein influencing the distribution or redistribution of deposits within the chamber of the trap device comprises accumulating deposits within at least one selected region therein.

131. The method of claim 110, wherein influencing the distribution or redistribution of deposits within the trap device comprises chemically inhibiting formation of deposits or removing deposits from along a substantially continuous path through the chamber of the trap device.

132. The method of claim 110, wherein influencing the distribution or redistribution of deposits within the trap device comprises thermally inhibiting formation of deposits or removing deposits from along a substantially continuous path through the chamber of the trap device.

133. The method of claim 110, wherein influencing the distribution or redistribution of deposits within the chamber of the trap device comprises removing deposits from a substantially continuous path therethrough at least once.

134. The method of claim 110, wherein influencing the distribution or redistribution of deposits within the chamber of the trap device comprises removing deposits along a substantially continuous path therethrough in relation to the measurement exceeding a predetermined value.

135. The method of claim 110, wherein influencing the distribution or redistribution of deposits within the chamber of the trap device comprises causing the chamber of the trap device to fill with deposits of constituents removed from the gaseous process stream passing therethrough in a substantially uniform manner therein.

136. The method of claim 110, wherein influencing the distribution or redistribution of deposits within the chamber of the trap device comprises causing the chamber of the trap device to fill with deposits of constituents removed from the gaseous process stream passing therethrough in a substantially uniform manner therein in response to the measuring.

137. The method of claim 110, wherein influencing the distribution or redistribution of deposits within the trap device comprises altering filling of deposits within the chamber of the trap device in response to the measuring.

138. A trap device for removing at least one undesirable constituent from a gaseous process stream passing through a vacuum system comprising:
- a chamber configured to operate at a pressure below atmospheric pressure;
- at least one substance delivery element associated with the chamber and configured to deliver at least one substance to an interior of the chamber; and
- at least one measurement device for measuring the thickness of a deposit comprising the at least one undesirable constituent within the interior of the chamber.

139. A method for forming deposits within a trap device having a chamber configured to remove at least one undesirable constituent from a gaseous process stream passing through a vacuum system comprising:
- causing a pressure below atmospheric pressure within a chamber of the trap device; and
- influencing distribution or redistribution of deposits comprising the at least one undesirable constituent within the chamber of the trap device during operation thereof by introducing a substance within the chamber of the trap device at more than one location.

* * * * *

UNITED STATES PATENT AND TRADEMARK OFFICE
CERTIFICATE OF CORRECTION

PATENT NO. : 7,044,997 B2  Page 1 of 1
APPLICATION NO. : 10/669755
DATED : May 16, 2006
INVENTOR(S) : Mardian et al.

It is certified that error appears in the above-identified patent and that said Letters Patent is hereby corrected as shown below:

On the title page, item (56), under "U.S. Patent Documents", in column 2, line 5, after "6,488,745" delete "B1" and insert -- B2 --, therefor.

On the title page, item (56), under "U.S. Patent Documents", in column 2, line 6, after "6,517,592" delete "B1" and insert -- B2 --, therefor.

In column 17, line 61, in Claim 2, after "the" insert -- first --.

In column 18, line 59, in Claim 20, after "device" insert -- of --.

In column 23, line 54, in Claim 103, after "element" delete "is".

Signed and Sealed this

Twenty Second Day of April, 2008

JON W. DUDAS
*Director of the United States Patent and Trademark Office*